United States Patent [19]
Watters et al.

[11] Patent Number: 5,982,324
[45] Date of Patent: Nov. 9, 1999

[54] COMBINING GPS WITH TOA/TDOA OF CELLULAR SIGNALS TO LOCATE TERMINAL

[75] Inventors: J. Michael Watters, Kanata; Leo Strawczynski, Ottawa; David G. Steer, Nepean, all of Canada

[73] Assignee: Nortel Networks Corporation, Montreal, Canada

[21] Appl. No.: 09/078,558

[22] Filed: May 14, 1998

[51] Int. Cl.[6] .............................. G01S 5/02; H04B 7/185
[52] U.S. Cl. .............................. 342/357.06; 342/357.01; 701/213
[58] Field of Search .................. 342/357, 457; 701/213; 455/456

[56] References Cited

U.S. PATENT DOCUMENTS

| | | | |
|---|---|---|---|
| 4,912,756 | 3/1990 | Hop | 155/54 |
| 5,043,736 | 8/1991 | Darnell et al. | 342/357 |
| 5,148,452 | 9/1992 | Kennedy et al. | 375/96 |
| 5,223,844 | 6/1993 | Mansell et al. | 342/357 |
| 5,271,034 | 12/1993 | Abaunza | 375/1 |
| 5,396,540 | 3/1995 | Gooch | 379/59 |
| 5,418,537 | 5/1995 | Bird | 342/357 |
| 5,434,787 | 7/1995 | Okamoto et al. | 364/449 |
| 5,467,282 | 11/1995 | Dennis | 364/449 |
| 5,479,482 | 12/1995 | Grimes | 379/59 |
| 5,497,339 | 3/1996 | Bernard | 364/705.05 |
| 5,519,403 | 5/1996 | Bickley et al. | 342/352 |
| 5,546,445 | 8/1996 | Dennison et al. | 379/360 |
| 5,576,716 | 11/1996 | Sadler | 342/357 |
| 5,587,715 | 12/1996 | Lewis | 342/357 |
| 5,604,765 | 2/1997 | Bruno et al. | 375/200 |
| 5,625,668 | 4/1997 | Loomis et al. | 379/58 |
| 5,646,630 | 7/1997 | Sheynblat et al. | 342/357 |
| 5,663,734 | 9/1997 | Krasner | 342/357 |
| 5,736,962 | 4/1998 | Tendler | 342/357 |

OTHER PUBLICATIONS

Krizman, et al., Wireless Position Location: Fundamentals, Implementaation Strategies, and Sources of Error, presented at the IEEE Conference on Vehicular Technology, Phoenix Arizona, May 5–7, 1997 and in the issue of the IEEE Communications Magazine, Apr. 1998, vol. 36, No. 4, pp. 30–59.

*Primary Examiner*—Thomas H. Tarcza
*Assistant Examiner*—Dao L. Phan
*Attorney, Agent, or Firm*—Foley & Lardner

[57] ABSTRACT

Aspects of global positioning system (GPS) technology and cellular technology are combined in order to provide an effective and efficient position location system. In a first aspect of the invention, a cellular network is utilized to collect differential GPS error correction data, which is forwarded to a mobile terminal over the cellular network. The mobile terminal receives this data, along with GPS pseudoranges using a GPS receiver, and calculates its position using this information. According to a second aspect, when the requisite number of GPS satellites are not in view of the mobile terminal, then a GPS pseudosatellite signal, broadcast from a base station of the cellular network, is received by the mobile terminal and processed as a substitute for the missing GPS satellite signal. A third aspect involves calculating position using GPS when the requisite number of GPS satellites are in view of a GPS receiver, but when the requisite number of GPS satellites are not in view of the GPS receiver, then position is calculated using the cellular network infrastructure. When the requisite number of GPS satellites come back into view of the GPS receiver, then position is again calculated using GPS. A fourth aspect involves using cellular signals already being transmitted from base stations to terminals in a cellular network to calculate a round trip delay, from which a distance calculation between the base station and the terminal can be made. This distance calculation substitutes for a missing GPS satellite signal.

17 Claims, 11 Drawing Sheets

CELL SPLITTING

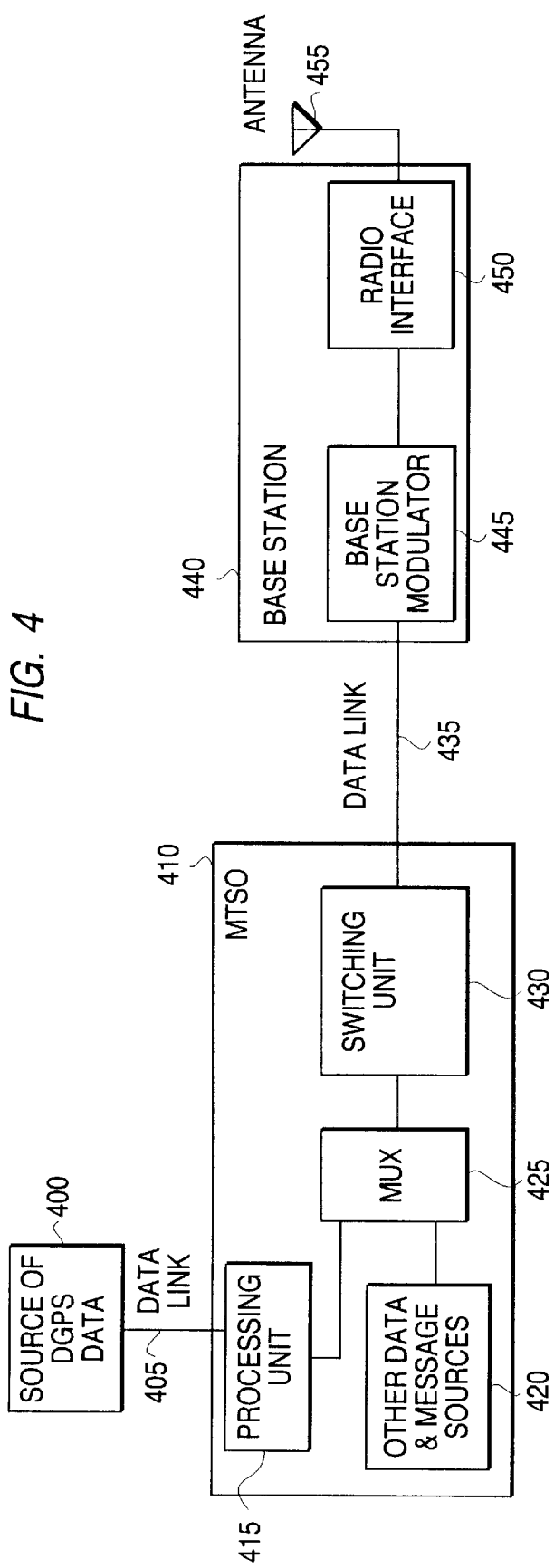
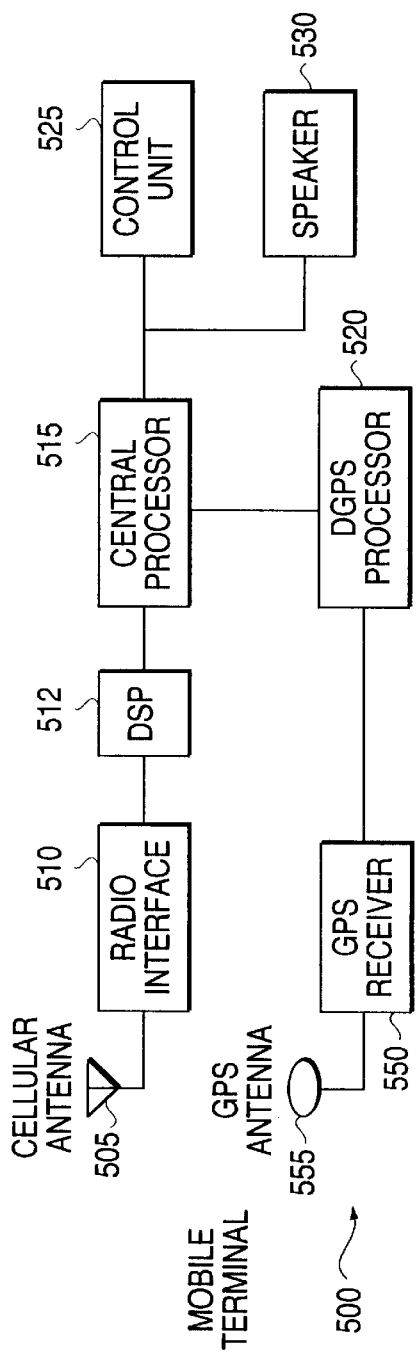
FIG. 4
FIG. 5

COMBINING GPS WITH TOA/TDOA OF CELLULAR SIGNALS TO LOCATE TERMINAL

TECHNICAL FIELD OF THE INVENTION

The present invention relates to global positioning satellite systems and cellular networks, and in particular, combining aspects of each technology in order to provide an efficient, reliable, and highly accurate position location system.

BACKGROUND OF THE INVENTION

The NAVSTAR (Navigation System with Time and Range) Global Positioning System (GPS) is a space-based radio-positioning and time-transfer system. While the system was originally developed primarily for military purposes, it now also contains a "coarse acquisition" (C/A) channel that is available for general civilian use. GPS provides accurate position, velocity, and time (PVT) information for a given object anywhere on the face of the earth, such as a moving mobile terminal in a vehicle. The NAVSTAR GPS includes three major system segments: (i) a space segment, (ii) a control segment, and (iii) a user segment. Briefly, the space segment has twenty four NAVSTAR satellites, each of which broadcasts radio frequency (RF) ranging codes and navigation data messages. Each navigation data message includes such data as satellite clock-bias data, ephemeris data (precise orbital data of the satellite), certain correction data, and satellite almanac data (coarse orbital data on the 24 satellites). The twenty four satellites are arranged in six orbital planes with four satellites in each plane, and the orbital planes are inclined at an angle of 55 degrees relative to the earth's equator. The control segment primarily consists of a master control station currently at Falcon Air Force Base in Colorado, along with monitor stations and ground antennas at various locations around the world. The master control station monitors and manages satellite constellation. The monitor stations passively track GPS satellites in view and collect ranging data for the satellites. This ranging data is transmitted to the master control system where satellite ephemeris and clock parameters are estimated and predicted. Furthermore, the master control system uses the ground antennas to periodically upload the ephemeris and clock data to each satellite for retransmission in the navigation data message. Finally, the user segment comprises GPS receivers, specially designed to receive, decode, and process the GPS satellite signals.

Generally, the satellites transmit ranging signals on two D-band frequencies: Link 1 (L1) at 1575.42 MHz and Link 2 (L2) at 1227.6 MHz. The satellite signals are transmitted using spread-spectrum techniques, employing ranging codes as spreading functions, a 1.023 MHz coarse acquisition code (C/A-code) on L1 and a 10.23 MHz precision code (P-code) on both L1 and L2. The C/A-code consists of a 1023 bit pseudorandom (PRN) code, and a different PRN code is assigned to each GPS satellite, as selected from a set of codes called Gold codes. The Gold codes are designed to minimize the probability that a receiver will mistake one code for another (i.e., minimize cross-correlation). The C/A-code is available for general civilian use, while the P-code is not. In addition, a 50 Hz navigation data message is superimposed on the C/A-code, and contains the data noted above.

In particular, the navigation message has 25 frames of data, each frame having 1,500 bits. Each frame is divided into five subframes of 300 bits each. At the 50 Hz transmission rate, it takes six seconds to receive a subframe, thirty seconds to receive one data frame, and 12.5 minutes to receive all twenty five frames. Subframes 1, 2, and 3 have the same data format for all twenty five frames. This allows the receiver to obtain critical satellite-specific data within thirty seconds. Subframe 1 contains the clock correction for the transmitting satellite, as well as parameters describing the accuracy and health of the broadcast signal. Subframes 2 and 3 contain ephemeris parameters. Finally, subframes 4 and 5 contain data common to all satellites and less critical for a receiver to acquire quickly, namely almanac data and low-precision clock corrections, along with other data.

The ranging codes broadcast by the satellites enable the GPS receiver to measure the transit time of the signals and thereby determine the range between the satellite and the receiver. It should be noted, however, that range measurements inherently contain an error called an offset bias common to all the measurements created by the unsynchronized operation of the satellite and the user's clocks. See U.S. Pat. No. 5,467,282 to Dennis. This user clock error will yield an erroneous range measurement, making it appear that the user is either closer to or farther from each of the satellites than is actually the case. These measurements are therefore more accurately termed pseudoranges. The navigation data messages enable the receiver to calculate the position of each satellite at the time the signals were transmitted.

In general, four GPS satellites must be in clear view of the GPS receiver in order for the receiver to accurately determine its location. The measurements from three GPS satellites allow the GPS receiver to calculate the three unknown parameters representing its three-dimensional position, while the fourth GPS satellite allows the GPS receiver to calculate the user clock error, and therefore determine a more precise time measurement. The GPS receiver compiles this information and determines its position using a series of simultaneous equations.

In addition, when the GPS receiver is first turned on, it must calculate its initial position. This initial determination is known as a "first fix" on location. Typically, the receiver must first determine which satellites are in clear view for tracking. If the receiver is able to immediately determine satellite visibility, the receiver will target a satellite and begin its acquisition process. If there is no almanac or position information already stored in the receiver, then the GPS receiver enters a "search the sky" operation that searches for satellites. Once the satellites are tracked, the receiver begins receiving the necessary data, as described above.

The "time-to-first-fix" (TTFF) represents the time required for a receiver to acquire the satellite signals and navigation data, and to calculate its initial position. If the receiver has no estimate of current time and position and a recent copy of almanac data, then this process generally takes about 12.5 minutes, which is the time necessary to receive a complete navigation data message assuming a 50 Hz transmission rate and receipt of twenty five frames of data, as described above.

A common problem with the conventional GPS is not having four GPS satellites in clear view of the GPS receiver. This commonly arises, for example, in a city setting such as in an urban canyon—i.e., in the shadow of a group of tall buildings—which can block the GPS satellite signals, or indoors in the buildings themselves. In such situations, the GPS receiver is unable to accurately determine its location using GPS.

Therefore, the need arises to find a replacement for the one or more missing GPS satellite signals. One method for accommodating this problem is to provide pseudosatellite signals that are transmitted in the GPS frequency band. They provide much the same information that the typical GPS satellite does, and are utilized by the GPS receiver in much the same fashion as the typical GPS satellite signal. These signals may originate from dedicated stations that are located on the ground at strategic locations, such as at airports. However, pseudosatellite signals are stronger than the GPS satellite signals and therefore, block the GPS signals. Thus, they generally transmit for only ten percent of the time. That is, they transmit periodically, known as burst mode, such as on for ten percent of the time and off for ninety percent of the time.

In addition to drowning out actual GPS satellite signals, the conventional pseudosatellite signal approach has other disadvantages. For one, there is the need to have specialized dedicated stations at strategic locations to transmit this information. This increases the cost of the GPS, and requires the need for obtaining permission from the landowner to set up and operate such dedicated stations. In addition, the user must be located within some specified distance of the station in order to receive the pseudosatellite signal, which is not always the case. Therefore, there is a need for a more efficient, less costly, and reliable alternative for addressing the situation of an inadequate number of GPS satellites being in clear view of the GPS receiver.

In addition, even when four satellites are in view, and the GPS receiver is readily receiving all of the necessary pseudorange data for calculating its position, there are further common errors present that result in erroneous position determinations. These errors include physical errors such as signal path delays through the atmosphere, i.e., propagation signal delay, and satellite clock and ephemeris errors. In addition, for civilian users, the Government introduces errors for national security reasons, generally known as selective availability errors (SA). SA primarily includes ephemeris data error and clock error, and results in an erroneous position determination of approximately 25 to 100 meters.

In order to help reduce the effects of these errors, a differential GPS (DGPS) may be employed. DGPS can achieve accuracies in the order of ten meters. The typical DGPS architecture includes one or more reference stations at precisely known, fixed reference sites, and DGPS receivers. The reference station includes a reference receiver antenna, a differential correction processing system, and data link equipment. As an example, the United States Coast Guard has set up reference stations that broadcast the differential correction data, which is typically used by ships.

There are two primary variations of the differential measuring techniques. One technique is based on ranging-code measurements and the other is based on carrier-phase measurements. In general, the ranging-code differential technique uses the pseudorange measurements of the reference station to calculate pseudorange or position corrections for the user receivers. The reference station calculates the pseudorange corrections for each visible satellite by subtracting the "true" range, determined by surveyed position and the known orbit parameters, from the measured pseudorange. The reference station typically broadcasts the pseudorange corrections in real-time on a low frequency beacon channel, which is received in real-time by the DGPS receiver. Of course, both the DGPS receiver and the reference receivers could alternatively collect and store the necessary data for later processing. The DGPS receiver selects the appropriate correction for each satellite that it is tracking, and subtracts the correction from the pseudorange that it has measured. For example, with the reference station set up by the Coast Guard, the station will broadcast the pseudorange corrections as radio signals. Ships having DGPS receivers receive this radio signal and process it to correct the pseudorange data obtained from the GPS satellites.

The other differential technique is the carrier-phase differential technique, which is typically used in applications requiring high accuracy such as in surveying or for an aircraft landing system. This method measures the difference in phase of the carrier at the reference and mobile unit. The ambiguity in the integer number of cycles is determined by either bringing the antennae of the reference unit and mobile unit close together (less than one wavelength), or by redundant measurements and complex search algorithms to determine the correct solutions.

Furthermore, DGPS may be designed to serve a limited area from a single reference station, which is generally called a local area DGPS (LADGPS). In the alternative, the system may use a network of reference stations and known algorithms to extend the validity of the DGPS technique over a wide area—known as Wide Area GPS, or WADGPS.

The typical DGPS presents certain drawbacks. One drawback is that the DGPS must use its own frequency band, so as not to interfere with that of the stand alone GPS. In addition, the DGPS receiver presents an additional receiver that must operate independent of the GPS receivers in receiving the differential correction data. These problems work in direct tension with the desire to make such systems as small and compact as possible, with as little additional circuit structure as possible, and still be as efficient as possible in terms of utilizing limited frequency.

Another area of interest for the present invention is cellular technology. FIGS. 1 and 2 show a typical cellular network, and its main components. See U.S. Pat. No. 5,546,445 to Dennison et al. The typical cellular network 100 covers a contiguous area that is generally broken down into a series of cells 110. Each cell has a base station 210 that maintains communication with the mobile terminal 220 (e.g., a cellular phone). The base station 210 includes a transmitter and receiver (or transceiver), and an antenna that transmits a wireless signal over a given area. The transmit power of the base station is directly related to the size of the cell, where the greater the transmit power of the base station, the larger the size of the cell.

The overall management of the cellular system is handled by a mobile telecommunications switching office (MTSO) 120. The MTSO provides numerous functions for the cellular system, such as assigning calls to a cell based on availability and signal strength, call statistics, and billing for the cellular network. The MTSO also functions as the interface between the cells and the Public Telephone Switching Network (PTSN) 140 for connection to the local telephone company 230 and long distance toll centers.

In configuring the cellular network, the desired size of the cell depends on the geographic nature of the coverage area and the amount of traffic expected in that area. Each cell uses a group of assigned frequencies or channels. In addition, where traffic becomes too heavy in a given area, the cell may be split into smaller cells by a process known in the art as "cell splitting." This concept is generally illustrated in FIG. 1.

In many instances, a cellular user also wishes to determine their location. The cellular user may carry around a GPS receiver for determining location. An alternative is to have the GPS receiver incorporated into the cellular mobile terminal. See, fur example, U.S. Pat. Nos. 5,043,736 to Darnell et al and 5,625,668 to Loomis et al. Methods also exist for determining location in a cellular system independent of GPS in order to determine location, such as using the cellular network infrastructure. Two examples for calculating position (though not the only methods) are (i) using Time Of Arrival (TOA) measurements when the time of transmission of the signal from the base stations is known, or (ii) using Time Difference of Arrival (TDOA) measurements when the actual time of transmission is not known, but periodic signals are available, as explained below.

Referring generally to FIG. 3, a typical urban street pattern 300 is shown to illustrate the first method of using TOA measurements. When the time of transmission of the signal from a base station 310 is known, a mobile terminal 320 simply determines when that transmitted signal is received. The difference in time from transmission to receipt, also known as the propagation delay, multiplied by the speed of light, provides a radial distance measurement R between that base station and the mobile terminal. Calculating the distance between the mobile terminal and three different base stations provides an accurate location fix for the mobile terminal, as the intersection of three spheres.

In the second method of utilizing TDOA measurements, while this approach can also be used when the actual time of transmission of the signal from the base stations is available, it may also be used when such time of transmission is not available, but periodic signals are. This may occur with some cellular systems. Some CDMA (Code Division Multiple Access) systems, such as those conforming to the IS-95 standard, do provide transmissions at well defined times.

The periodic signal entails each of the base stations transmitting periodic signals that are synchronized with one another. In that regard, all of the base stations may transmit their periodic signals at the same exact time, or with some specified timing offset between base stations. In this method, the mobile terminal measures the difference in time between the arrival of a signal from one base station with respect to another. This time difference of arrival (TDOA), together with the known locations of the two base stations and the speed of radio signal transmission, defines a hyperbolic surface with the base stations at the foci. The mobile terminal's location is somewhere on this surface. Thus, a single TDOA measurement does not uniquely define the location of the mobile terminal. However, a similar measurement for signals from other pairs of base stations defines additional surfaces. By measuring the TDOA of the signals from three base stations, three surfaces can be determined, the common intersection of which establishes the location of the mobile terminal.

Further information and systems regarding conventional TDOA location systems and methods may be found in Krizman et al., "Wireless Position Location Fundamentals, Implementation Strategies, and Sources of Error," presented at the IEEE Conference on Vehicular Technology, Phoenix, Ariz., May 5–7, 1997 and in the issue of the IEEE Communications Magazine, April 1998, Vol. 36, No. 4, pages 30–59. The entirety of this reference is hereby incorporated into the present disclosure for its teachings regarding conventional TDOA location methods and systems.

However, problems exist with using these two methods for determining location. One significant problem results from multi-path errors. Such errors result from changes in the transmission path of the signal that the mobile terminal receives from the base station. For example, when the user of the mobile terminal goes around a corner, the mobile terminal may receive a new signal from the base station that has followed a completely different transmission path compared to the old signal that the mobile terminal was previously receiving before the user turned the corner. Therefore, the distance traveled by the signal will likely differ. This causes a change in time measurement by the mobile terminal that does not accurately represent the actual distance change of the mobile terminal from the base station, thereby rendering an inaccurate location determination by the mobile terminal.

Another problem encountered is that the typical clock in a cellular mobile terminal does not measure time precisely, and may have a tendency to drift, generally known as clock drift. Therefore, the time measurements made by the terminal are not extremely accurate, which results in an erroneous time—and therefore location—determination. The error due to the drift grows larger the longer the mobile terminal clock is used.

In sum, as shown above, a need exists for a more efficient and less costly structure compared to the conventional DGPS receiver. In addition, a need exists for more efficient, reliable, and effective solutions to address the problem of receiving an inadequate number of satellite signals from the GPS satellites.

SUMMARY OF THE PRESENT INVENTION

It is an object of the present invention to provide a system that combines GPS and cellular technology in order to overcome deficiencies associated with the use of either technology alone, in order to provide a more efficient, reliable, and effective position determination for a given object such as a mobile terminal.

It is a further object of the present invention to provide a position location system that utilizes the cellular network to forward DGPS error correction information to a mobile terminal.

It is yet another object of the present invention to provide a position location system that efficiently utilizes the cellular frequency band available in a cellular network for forwarding DGPS error correction information to a mobile terminal.

It is a further object of the present invention to provide a position location system that provides a cellular network with the capability of receiving and forwarding DGPS error correction information that is utilized by the mobile terminal for accurately determining its position.

It is another object of the present invention to provide a position location system that provides a cellular network with the capability of receiving and forwarding DGPS error correction information to a DGPS processor, and also forwarding GPS pseudoranges from the mobile terminal to the DGPS processor, wherein the GPS pseudoranges are corrected.

It is yet another object of the present invention to provide a position location system that compensates for the inability of mobile terminal containing a GPS receiver to view the requisite number of GPS satellites to obtain an accurate fix on its location.

It is yet a further object of the present invention to provide a position location system that utilizes the base station of a cellular network to transmit GPS pseudosatellite signals such that if the requisite number of GPS satellites are not in clear view of the mobile terminal containing the GPS receiver, the mobile terminal can accurately determine its position using both cellular-based pseudosatellite signals and available GPS signals.

It is another object of the present invention to provide a position location system that includes a base station in a cellular network that is capable of generating and transmitting GPS pseudosatellite signals independent of receiving GPS signals.

It is a further object of the present invention to provide a position location system that includes a mobile terminal capable of receiving a GPS pseudosatellite signal from a base station of a cellular network, and processing that signal as a substitute for a missing GPS satellite signal, and in combination with available GPS satellite signals, to determine position.

It is another object of the present invention to provide a position location system that efficiently makes use of both a position location scheme using the cellular network infrastructure and a GPS location system when the requisite number of GPS satellites are not in clear view of the mobile terminal containing the GPS receiver.

It is a further object of the present invention to provide a position location system that makes use of information from both the GPS and the cellular network infrastructure to provide improved accuracy and reliability than could be achieved by either system working alone.

It is yet a further object of the present invention to provide a position location system that makes use of a position location scheme using the cellular network infrastructure and a GPS location system as appropriate to minimize power consumption in the terminal.

It is a further object of the present invention to provide a position location system that efficiently switches to a position location scheme based on a combination of using the cellular network infrastructure and the available GPS satellite signals when the requisite number of GPS satellites are not in clear view of the mobile terminal containing the GPS receiver.

It is yet another object of the present invention to provide a position location system that converts from a position location scheme using the cellular network infrastructure to GPS when the requisite number of GPS satellites are in clear view of the mobile terminal containing the GPS receiver.

It is yet a further object of the present invention to provide a position location system that utilizes GPS technology to reduce the problems associated with the position location scheme that uses the cellular network infrastructure.

It is another object of the present invention to provide a position location system that reduces the effects of radio multi-path propagation and clock drift associated with position location schemes using cellular network infrastructure by utilizing GPS technology.

It is yet a further object of the present invention to provide a position location system that efficiently utilizes cellular signals of a CDMA or TDMA system to augment the position determination.

In order to achieve these and other objects, the present invention provides a position location system that incorporates particular aspects of the cellular network with GPS. For one, in the position location system of the present invention, the cellular network is utilized to collect DGPS error correction information, and forward it to the mobile terminal over the established cellular network in the cellular band. The mobile terminal includes a DGPS processor that processes the information, along with pseudoranges received from a GPS receiver, in order to calculate a more precise position than that obtained from GPS standing alone. In the alternative, the DGPS processor is connected to a communications network which is also connected to the base station, and receives DGPS error correction data, along with the pseudoranges from the GPS receiver, over the cellular network (from the mobile). The DGPS processor uses this information to correct the pseudoranges to obtain more accurate ranges.

Second, in the position location system of the present invention, when the requisite number of GPS satellites are not in view of the GPS receiver, the system utilizes a GPS pseudosatellite signal that is generated by one or more base stations of the cellular network independent of the GPS, that is, independent of having to receive GPS signals at the base station. The base stations are modified to generate and broadcast such pseudosatellite signals, and the pseudosatellite signal is received and processed by the mobile terminal as a substitute for an actual GPS satellite signal. Processing this information along with the satellite signal information from the GPS satellites that are in clear view, the mobile terminal is able to determine its position more accurately.

Third, in the position location system of the present invention, when the requisite number of GPS satellites are not in clear view of the GPS receiver, the system switches from relying on the GPS portion of the system to utilizing cellular network infrastructure to determine location. This can be done, for example, by using either the TOA or TDOA methods for determining location in a cellular network portion of the system. Furthermore, when the mobile terminal is moved to a location where the requisite number of satellites are again in clear view of the GPS receiver, the system efficiently switches back to using the GPS portion of the system to determine location. An alternative is to use a combination of GPS satellite signals and cellular signals from base stations to calculate position.

Fourth, the cellular signals already transmnitted, for example, in a CDMA or TDMA (Time Division Multiple Access) system may be used as a replacement of a missing GPS signal or to augment and improve GPS measurements. Using either the CDMA or TDMA system, a round trip delay is calculated with respect to a base station, from which the radius of the terminal from the base station is calculated. Further calibration can be achieved by calculating a timing offset correction, to achieve a more accurate radius measurement.

Other objects, features, and advantages of the present invention will become apparent from reading the following Detailed Description in conjunction with the accompanying drawing figures.

BRIEF DESCRIPTION OF THE DRAWING FIGURES

FIG. 4 is a block diagram of a mobile telecommunications switching office (MTSO) and base station for implementing a first aspect of the position location system of the present invention.

FIG. 5 is a block diagram of a mobile terminal for carrying out the first aspect of the position location system of the present invention.

DETAILED DESCRIPTION OF THE PREFERRED EMBODIMENTS

Figure 1:
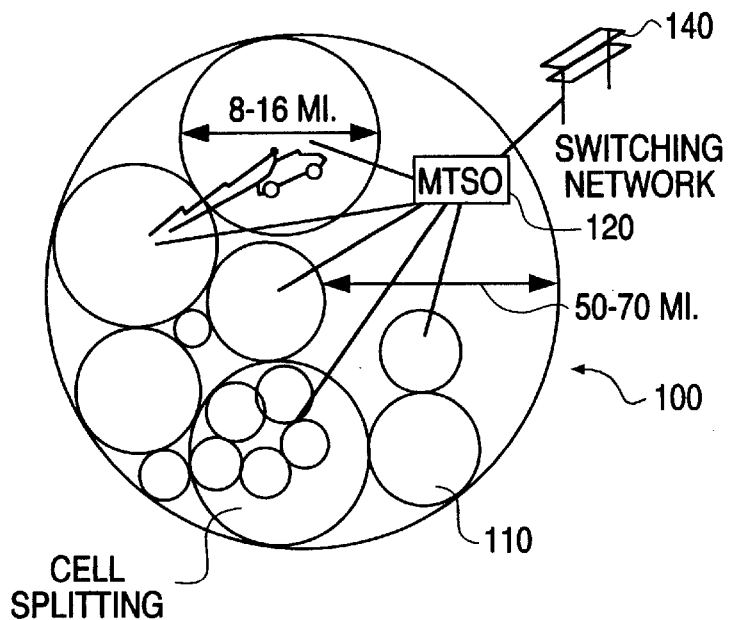
FIG. 1 illustrates a conventional cellular network area divided into a plurality of cells.
Figure 2:
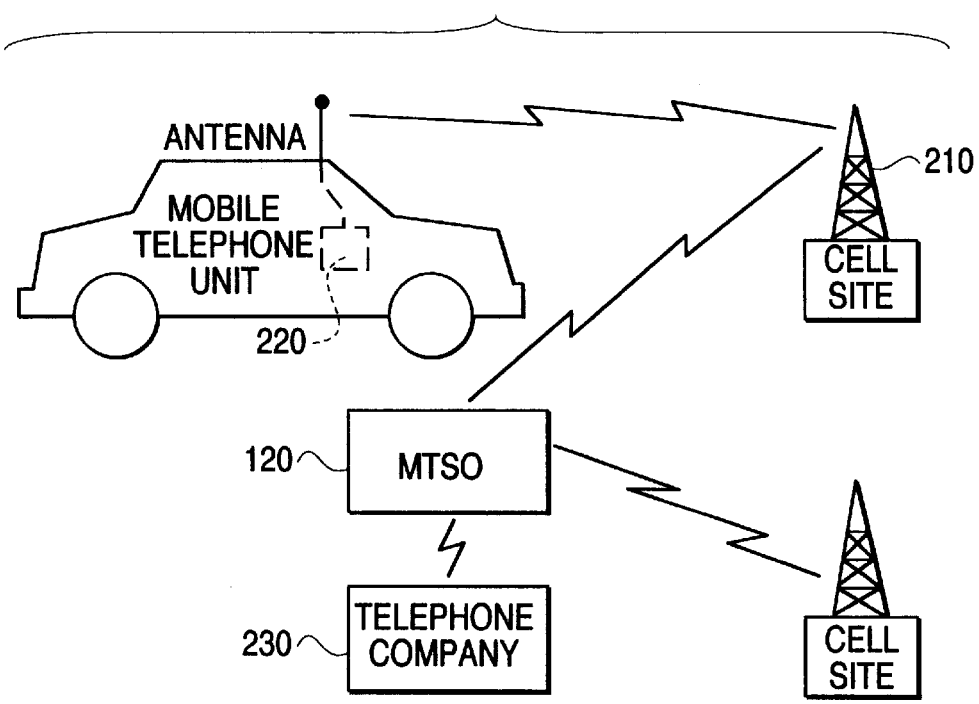
FIG. 2 illustrates the major components of a conventional cellular network scheme.
Figure 3:
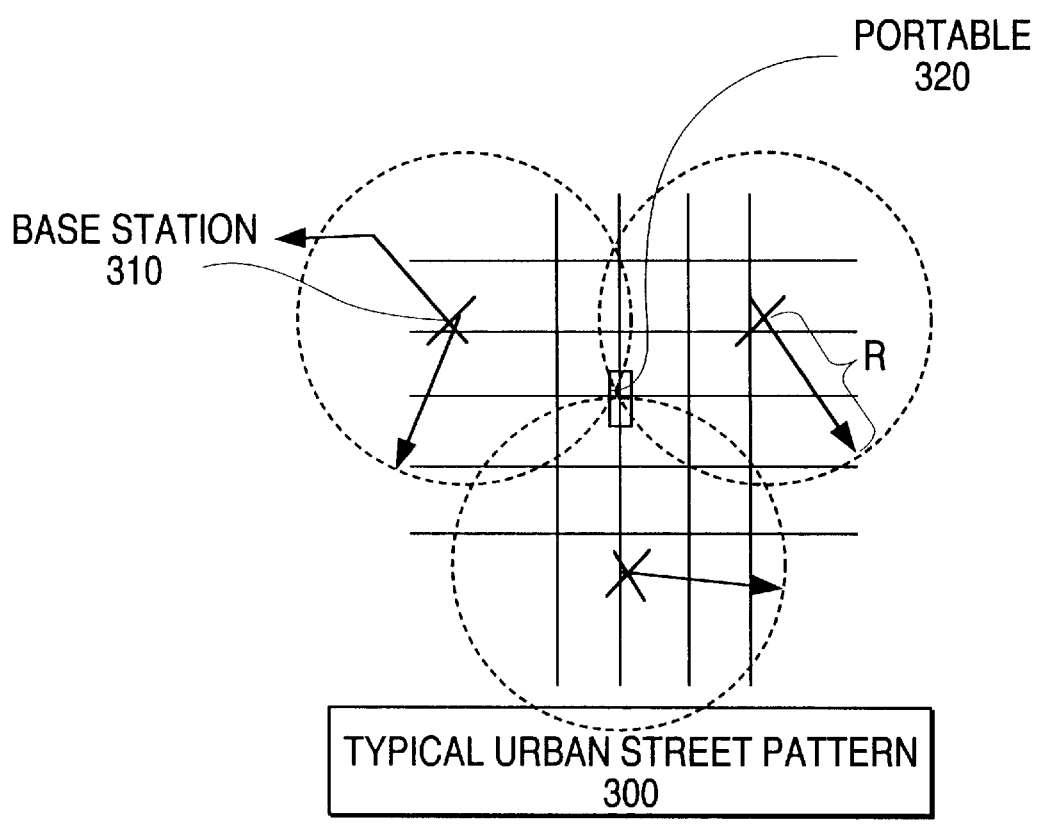
FIG. 3 illustrates the concept of determining position of a mobile terminal based on Time of Arrival measurements in a cellular network system.

The various aspects of a position location system according to the present invention are described below.

First Aspect

Referring to FIGS. 4 and 5, a first aspect of a position location system of the present invention will be described. Broadly, FIG. 4 shows a source for DGPS error correction data 400, a cellular mobile telecommunications switching unit 410, and a base station 440. FIG. 5 shows a mobile terminal 500, which is typically at a remote location relative to the cellular mobile telecommunications switching unit and in the transmitting vicinity of the base station 440. The transmitting vicinity is the area over which the base station broadcasts its signals. In general, this aspect of the invention involves the use of the cellular network to transmit DGPS error correction data to the mobile terminal, where it is used to perform corrections on pseudorange data also received at the mobile terminal.

First, in FIG. 4, the source 400 is responsible for providing DGPS error correction data (i.e., differential error correction data). Numerous alternatives for source 400 exist to provide such information, including using Government sources, commercial operators, or the cellular operator. For example, the source 400 may be a Government source, such as the Coast Guard, which broadcasts DGPS error correction data as radio signals from reference stations that it has established. Alternatively, a commercial supplier may be used to supply the DGPS error correction data. Two examples of such commercial suppliers are Differential Correction, Inc. (DCI) of California, and Omnistar, Inc. of Texas. In particular, DCI currently uses FM radio stations to broadcast the correction information while Omnistar uses a geostationary satellite to broadcast the correction information.

A third alternative is that the cellular provider set up its own reference stations that calculate the pseudorange corrections for each visible satellite and broadcast them over the cellular network. In that case, the reference stations may be part of the base stations in the cellular network system.

For any particular application, depending on which alternative is selected for use as the source 400, the source will contain an appropriate receiver, such as a satellite receiver, an FM receiver, a beacon receiver, etc. For example, if Omnistar were used as the source, then a satellite receiver would be necessary. It should be noted that the signal received will be in the satellite frequency band. The typical overall satellite frequency band includes approximately 1200–1600 MHz and 3500–4300 MHz. The Omnistar system, for example, uses the 1551.489, 1554.497 and 1556.825 MHz frequencies for its coverage of the United States.

Furthermore, the present invention contemplates a system that has two or more of the above-noted sources available, and obtaining the information from one or more of those sources as desired. For example, the system may have the ability to receive DGPS error correction information from both a commercial supplier and reference stations set up by the cellular provider. In that circumstance, the source 400 would include circuitry that would decide which source to utilize, based on, for example, availability of each source.

In addition to receiving the differential error correction data, the source 400 will generally also convert the data into a standard DGPS signal, such as, for example, as defined by RTCM SC-104 (Radio Technical Commission for Maritime Services, Special Committee-104), which has developed international standards for digital messaging. The DGPS signal is forwarded over a data link 405 to the cellular mobile telecommunications switching unit 410, which is here a modified version of a mobile telecommunications switching office (MTSO) known in the art. Data link 405 may be any type known in the art and compatible for use with the MTSO 410.

Furthermore, relevant to this aspect of the invention, the MTSO 410 includes a processing unit 415, a central unit 420 that is capable of receiving data and messages from other sources, a multiplexer 425, and a switching unit 430. Processing unit 415 is responsible for converting the DGPS signal into a proper format for further transmission over the cellular network. For example, processing unit 415 may convert the received signal into a short message by using a short message service (SMS) as defined in the Global System for Mobile Communication (GSM) standard. GSM represents a mobile cellular system as defined by a set of operating standards, as introduced by the European body ETSI. For the purposes of understanding the present invention, a short message is essentially a data packet containing the DGPS signal.

Central unit 420 contains other data and message sources that are supplying information that must be forwarded by the MTSO 410. Such information would include other short messages intended for transmission to the same base station, voice data, data traffic for users having modems at the mobile terminal, and the like. This other information in the central unit 420 is combined with the short message containing the differential error correction data using multiplexer 425 to create a combined signal.

Thereafter, the combined signal is transmitted to a switching unit 430 of the MTSO 410 which is responsible for switching the data to an appropriate data link 435 for forwarding to one of numerous cellular network base stations in the cellular system. Here, the intended base station for receiving the combined signal is represented by reference numeral 440. Base station 440 includes a base station modulator 445 that modulates the signal, and then transmits it through a radio interface 450 and a base station antenna 455. It should be noted that the transmission of the signal by the base station will be in the cellular frequency band. The typical overall cellular frequency band includes approximately 800–900 MHz and 1850–1990 MHz.

Figure 4A:
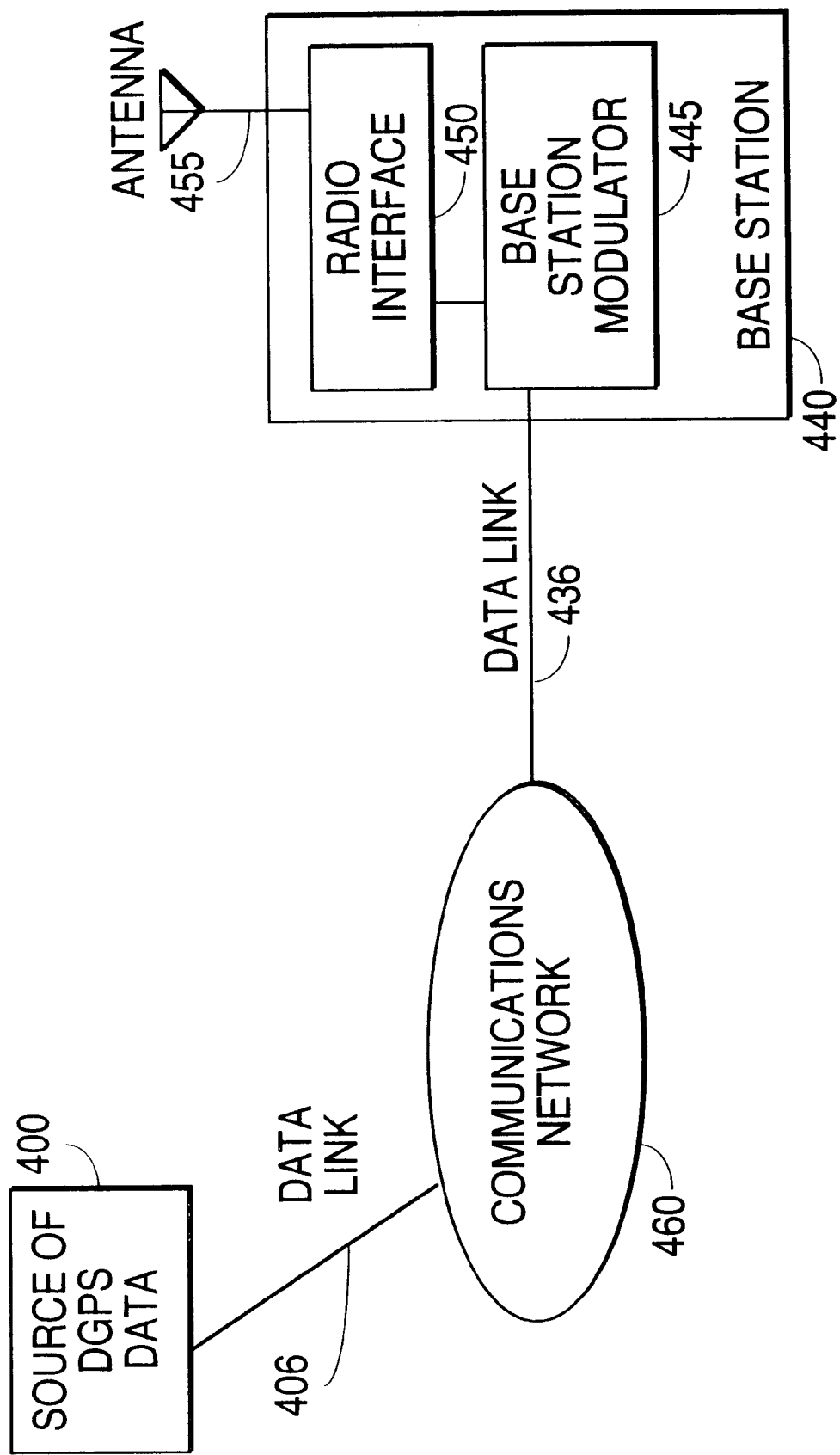
FIG. 4A is a block diagram of a communications network and base station for implementing a first aspect of the position location system of the present invention.

An analogous FIG. 4A shows the preferred arrangement. In this arrangement the source of DGPS data 400 is connected to a communications network 460 by a data link 406. In this view the source of DGPS data may be, for example, a workstation or server attached to the Internet and providing DGPS data for many base stations in one or more mobile networks. Although this server provides a logically separate function, it may be combined with, or physically located in conjunction with, a part of the communications network (for example such as an MTSO). It should be noted that the communications network may simply be an MTSO (as shown in FIG. 4), include an MTSO or a plurality of MTSOs with other components, or may itself not include any MTSOs. The server may also be operated by a third party, separate from the mobile network operator, and located remotely from the communications network components. The base station 440 is also connected to the communications network through data link 436. The communications network interconnects the source of DGPS data and the base station and provides the similar functions to the MTSO shown in FIG. 4 of receiving messages from the DGPS source and combining these together with other data and messages destined for the base station for transmission to the mobile terminals served by the base station. Such a communications network, for example, is provided by the Internet and the associated Internet protocols (IP) for addressing, formatting, sending and receiving messages to devices attached to the network.

The signal containing the short message with the DGPS error correction data is transmitted as a radio frequency signal in the cellular band to the mobile terminal 500, which is shown in FIG. 5. Mobile terminal 500 generally includes a cellular antenna 505, a radio interface 510, a digital signal processor (DSP) 512, a central processor 515, a DGPS processor 520, a control unit 525, a speaker 530, and a GPS receiver 550 having a GPS antenna 555. Mobile terminal 500 receives the radio frequency signal via the cellular antenna 505, and forwards it to the radio interface 510. Radio interface 510 converts that signal into an intermediate frequency (IF) signal that is compatible with the DSP 512, and forwards the signal to the DSP 512. The DSP 512 demodulates the signal into a data stream and forwards that data stream to the central processor 515. Central processor 515 is responsible for determining the contents of the data stream and forwarding the appropriate portions of the data stream to their intended destinations. For example, a typical data stream may contain short messages, one of which is the DGPS error correction data, control data, voice data, and other information.

Regarding the short message carrying DGPS error correction data, the central processor 515 utilizes the protocol of the short message, which use of protocol is known in the art, to extract the error correction data out of the signal and forward it to the DGPS processor 520. In addition, for illustrative purposes, the central processor 515 forwards control data to the control unit 525, while voice data may be processed and forwarded to the speaker 530. FIG. 5 does not depict all of the various destinations for all types of data encountered by the central processor 515.

In addition, the GPS receiver 550 receives satellite signals by the GPS antenna 555 from the GPS satellites that are in view, and calculates the pseudoranges between the mobile terminal and each of the GPS satellites. GPS receiver 550 forwards these pseudoranges to the DGPS processor 520.

DGPS processor 520 utilizes the DGPS error correction data in a conventional manner to correct the calculated pseudoranges. The corrected ranges are forwarded back to the GPS receiver 550, which then utilizes the information to calculate a more accurate position of the mobile terminal 500 than could be achieved by using GPS standing alone.

It should be noted that the cellular antenna 505 and the GPS antenna 555 may be formed as a single antenna that is capable of receiving both types of signals, and may use, for example, an amplifier that responds to both cellular and satellite bands.

Figure 6:
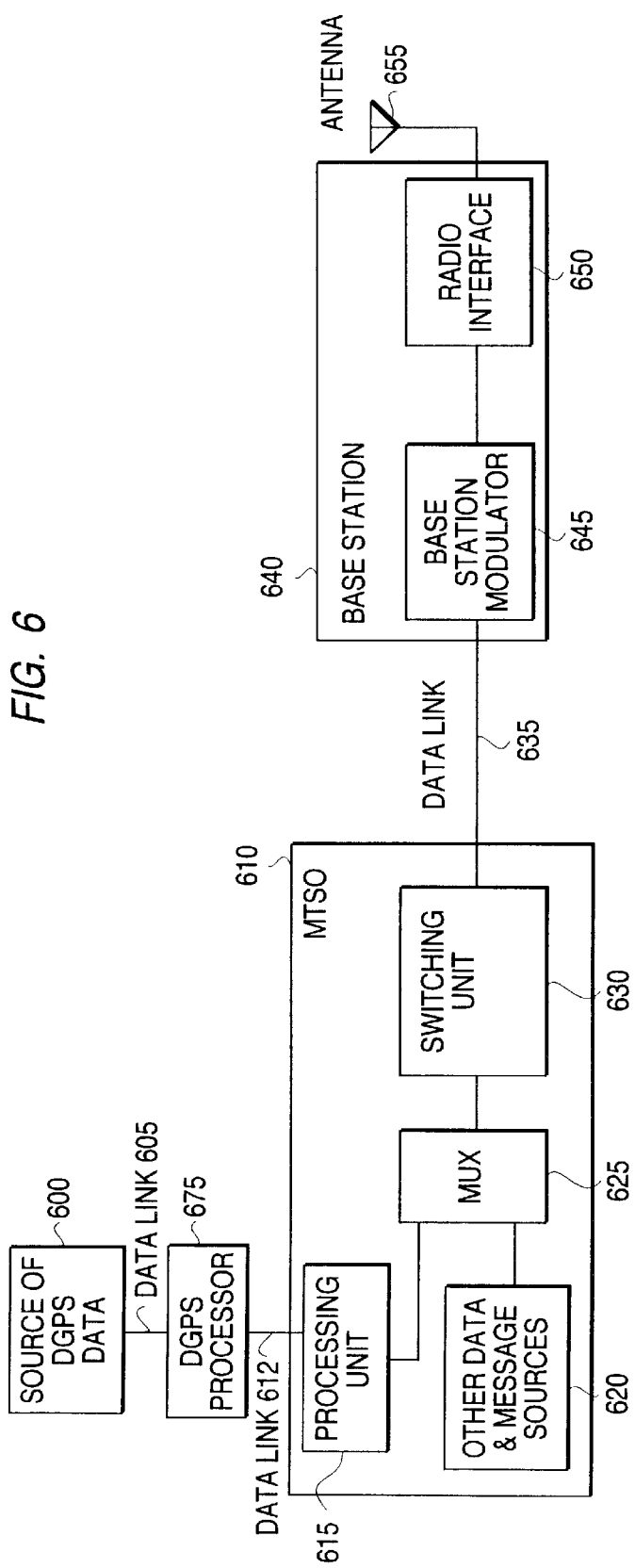
FIG. 6 is a block diagram of an alternative embodiment of the MTSO and base station for implementing the first aspect of the position location system of the present invention.
Figure 7:
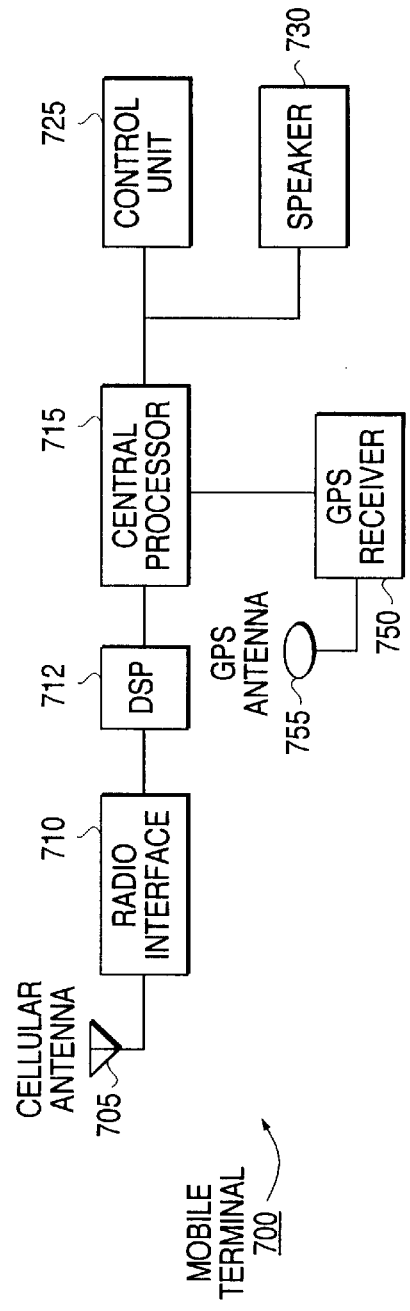
FIG. 7 is a block diagram of an alternative embodiment of the mobile terminal for carrying out the first aspect of the position location system of the present invention.
Figure 6A:
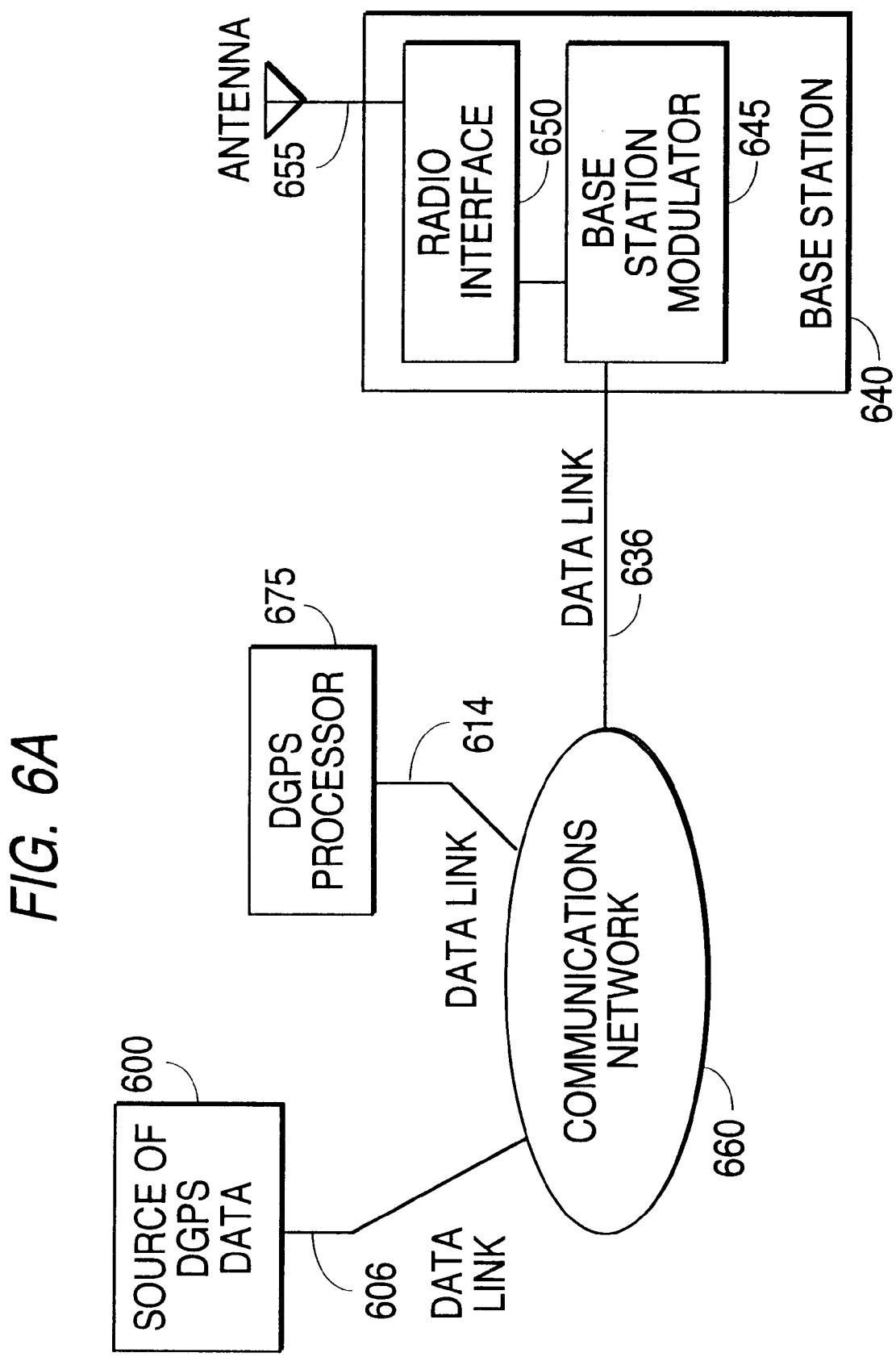
FIG. 6A is a block diagram of an alternative embodiment of a communications network and base station for implementing a first aspect of the position location system of the present invention.

An alternative structure for carrying out the correction of the pseudoranges is shown by FIGS. 6, 6A and 7. Much of the structure remains similar as in the embodiment shown in FIGS. 4, 4A and 5, for which analogous reference numerals have been used. However, in this embodiment, the mobile terminal 700 has no DGPS processor. Rather, a DGPS processor 675 is connected to a source of DGPS data 600 by a data link 605, and is connected by another data link 612 to a processing unit 615 (which may be a multitude of processors) in a MTSO 610.

The remaining elements are a central unit 620, a multiplexer 625, and a switching unit 630 in the MTSO 610, a data link 635, and a base station 640 that includes a base station modulator 645, a radio interface 650 and a base station antenna 655.

An analogous FIG. 6A shows the preferred arrangement. In this arrangement the source of DGPS data 600 is connected to a communications network 660 by a data link 606. In this view the source of DGPS data may be, for example, a workstation or server attached to the Internet and providing DGPS data to one or more base stations in one or more mobile networks. Similarly the DGPS processor 675 is also attached to the communications network through data link 614. In this view the DGPS processor may also be, for example, a server attached to the Internet and providing DGPS processing services for one or more base stations and their associated mobile terminals in one or more mobile networks. The base station 640 is also connected to the communications network through data link 636. The communications network interconnects the source of DGPS data, the DGPS processor and the base station and provides the similar functions to the MTSO shown in FIG. 6 of receiving messages from the DGPS source and combining these together with other data and messages destined for the base station for transmission to the mobile terminals served by the base station. Similarly the communications network provides the function of transporting messages reporting GPS pseudoranges received by the base station from the mobile terminals to the DGPS processor. Such a communications network, for example, is provided by the Internet and the associated Internet protocols (IP) for addressing, formatting, sending and receiving messages to devices attached to the network.

Furthermore, the mobile terminal 700 contains a cellular antenna 705, a radio interface 710, a digital signal processor (DSP) 712, a central processor 715, a control unit 725, a speaker 730, and a GPS receiver 750 having a GPS antenna 755.

In this embodiment, the GPS receiver 750 receives satellite signals by the GPS antenna 755 from the GPS satellites that are in its view and calculates the pseudoranges between the mobile terminal 700 and each of the GPS satellites. The results of this determination, i.e., the calculated pseudoranges, are then forwarded through the system to the DGPS processor 675 as described below. It should be noted that this may be done automatically in a continuous fashion, i.e., each time the GPS receiver 750 calculates pseudoranges it also forwards the pseudoranges to the DGPS processor 675. Alternatively, it may be done upon a specific request to the GPS receiver 750.

Forwarding of the calculated pseudoranges to the DGPS processor 675 may be carried out by forwarding the calculated pseudoranges to the central processor 715, which multiplexes the calculated pseudoranges into a data stream that is forwarded to the DSP 712. The DSP 712 modulates the data stream into an IF signal and forwards the signal to the radio interface 710. The radio interface 710 converts the IF signal into a radio frequency signal having a frequency that is in the cellular band. The cellular signal is transmitted to be received at the base station 640. Base station 640 demodulates the signal, and forwards the demodulated signal message through the data links to the DGPS processor 675. If the signal message passes through data link 635 to the MTSO 610, the MTSO extracts the calculated pseudorange messages, for example, by using the processing unit 615, and forwards them over the data link 612 to the DGPS processor 675. If the signal message passes through data link 636 to a communications network, it will be received by the DGPS processor through data link 614 where the relevant pseudorange messages may be extracted.

In addition, the source 600 provides a signal containing the DGPS error correction data to the DGPS processor 675. Therefore, the DGPS processor 675 will have the pseudoranges as calculated by the GPS receiver 750, along with the necessary error correction data from the source 600. DGPS processor 675 performs the required corrections on the calculated pseudoranges and transmits the corrected ranges back through the system to the GPS receiver 750. GPS receiver 750 then calculates a more accurate position of the mobile terminal 700 using these corrected pseudoranges.

In the alternative, DGPS processor 675 could calculate the corrected position of the mobile and forward the position to the mobile for display, or to the network service or other service requesting the position. The requesting service may be a process of the cellular network itself, or it may be a server operated by a third party connected to the communications network.

It should be noted that in either of the embodiments shown in FIGS. 4 (4A), 5 and FIGS. 6 (6A),7, one or more of the elements may be integrally formed with other elements, i.e., be formed as part of a single unit. For example, the DGPS processor may be integral with the central processor or the GPS receiver of the mobile terminal. In addition, while not described in detail, the DGPS processor may alternatively be located at the base station or other locations and connected to the base station through the communications network. In addition, the first aspect of the position location system of the present invention may be used with either a local area DGPS (LADGPS) system or a wide area DGPS (WADGPS) system.

This aspect of the invention provides numerous advantages over the conventional systems. For one, there is no need for a separate beacon receiver at each mobile terminal for receiving the DGPS error correction information from the source. That is, in the conventional DGPS approach, each individual mobile terminal containing a DGPS receiver/processor needs a beacon receiver for receiving the DGPS signal. By way of the present invention, the need for a beacon receiver at each mobile terminal is eliminated. Rather, the mobile terminal need only have a DGPS processor to process the DGPS signal and correct the pseudoranges calculated by the GPS receiver. This means a reduction in the amount of structure present in the mobile terminal, thereby allowing for a smaller size and lower cost.

Furthermore, in the embodiment where the DGPS processor is connected to the base station through the communications network, there is also no need for a separate DGPS processor at each mobile terminal. This reduces the number of DGPS processors necessary, since there is no need to have a separate processor in each mobile terminal. This allows for a further reduction in size and cost of the mobile terminal without sacrificing the accuracy of position determinations made possible using DGPS. This configuration also reduces the message traffic between the network and the terminal by allowing the position location determined by the DGPS processor to be sent directly to the network service requesting the information.

In addition, the present invention utilizes the frequency band already dedicated for cellular use for performing additional functions, here the transmission of DGPS error correction data. Therefore, more efficient use of the cellular band is made with this invention. Moreover, the cellular network provides an efficient means for having the DGPS error correction information transmitted to the mobile terminal. That is, in certain instances, the mobile terminal may be located in an area where reception of the DGPS signal from a specified reference station is not possible. For example, the mobile terminal may not be within the proper range of the reference station. The cellular network is generally available in such circumstances, and it can provide the necessary DGPS error correction information. Therefore, the user will not lose the accuracy attributable to DGPS.

Second Aspect

Figure 8:
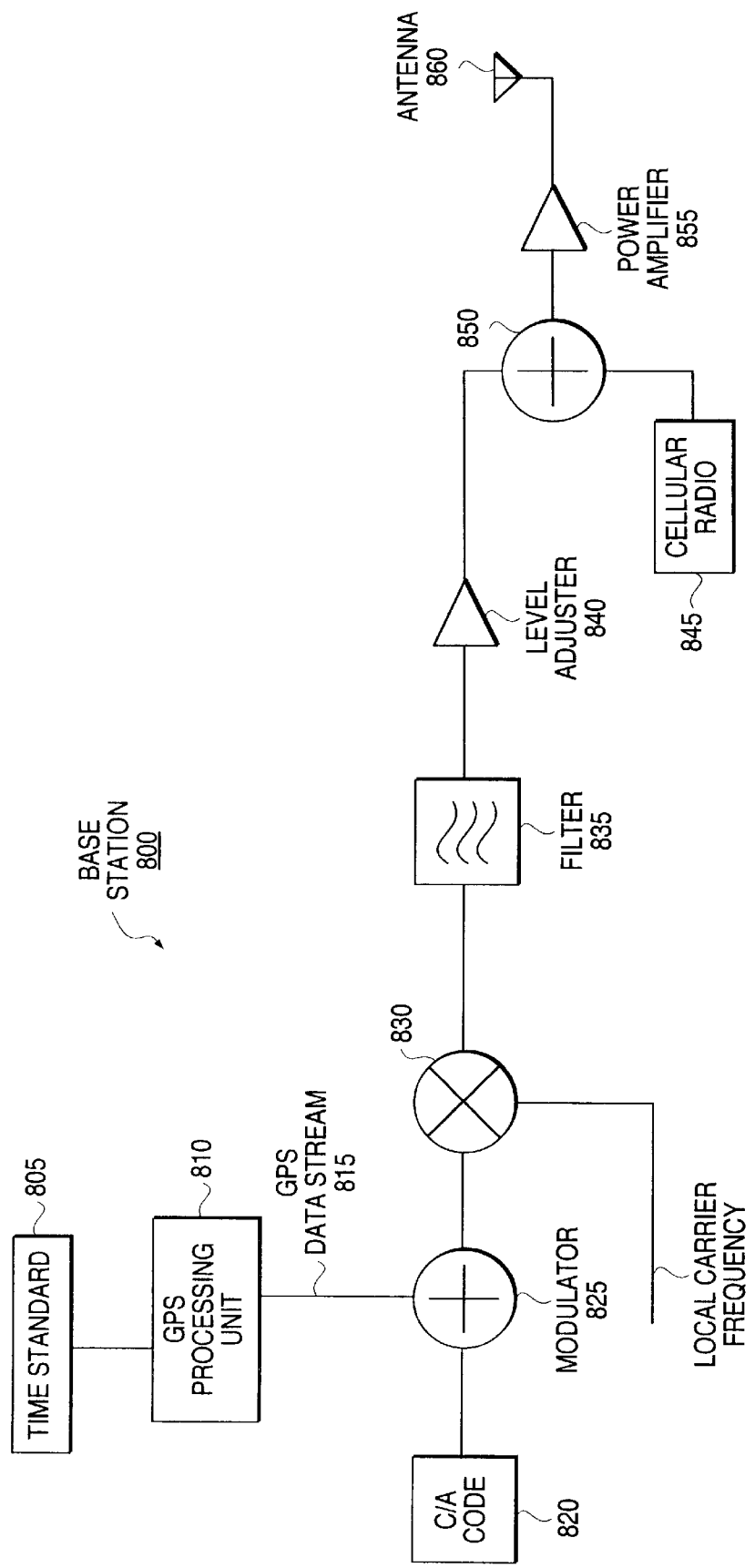
FIG. 8 is a block diagram of a base station for implementing a second aspect of the position location system of the present invention.
Figure 9:
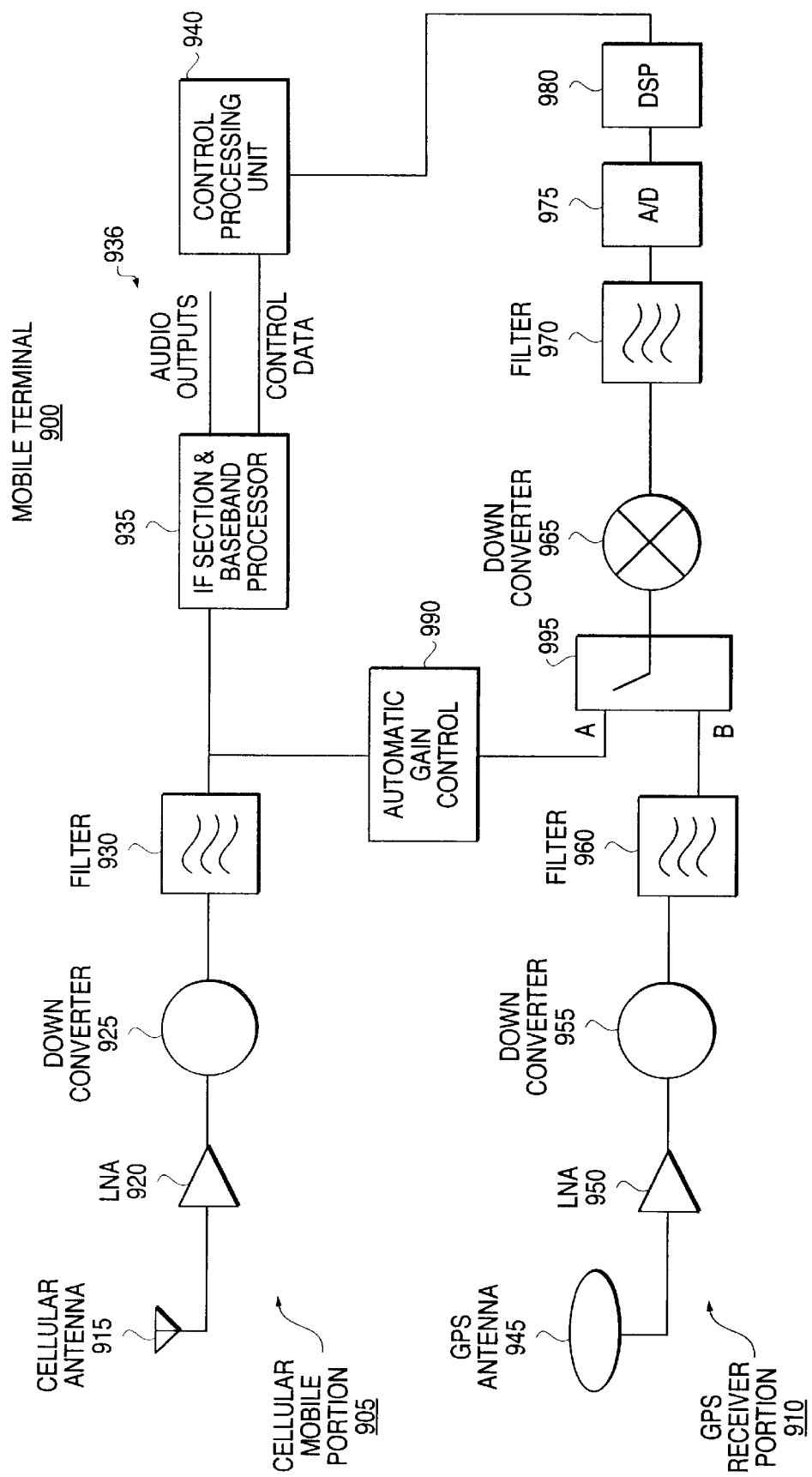
FIG. 9 is a block diagram of a mobile terminal for carrying out the second aspect of the position location system of the present invention.

Referring now to FIGS. 8 and 9, a second aspect of the position location system of the present invention will be described. This aspect addresses the problem described above of a GPS receiver not having the requisite number of GPS satellites in clear view. For example, in a typical situation, four GPS satellites must be in clear view of the GPS receiver in order for the GPS receiver to gain an accurate fix on its location. Of course, the requisite number of GPS satellites that must be in view may be less than four when the GPS receiver has one or more components of its location already known. It is assumed for the purposes of illustration of this embodiment that four GPS satellites are needed, but only three of those satellites are in clear view. This may occur, for example, when the GPS receiver is in a city setting, such as in an urban canyon, i.e., in the shadow of a group of tall buildings, or indoors. Of course, there are numerous other reasons why the GPS receiver may not be receiving signals from the requisite number of GPS satellites, which are not listed here.

Broadly, in the present invention, a base station of the cellular network provides a pseudosatellite signal that may be used by the GPS receiver as a replacement for a GPS satellite that is not in clear view. Furthermore, the base station provides the pseudosatellite signals within the cellular band, i.e., over the cellular network. In order to carry out this aspect of the invention, the base station needs to be modified, along with the mobile terminal, as described below.

Referring to FIG. 8, a base station 800 according to this aspect of the present invention is shown. Base station 800 includes a time standard 805 and a GPS processing unit 810. The time standard may be an independent reference unit such as a commercially available cesium based reference clock. Alternatively, the cellular network infrastructure, used to synchronize base station transmissions, may also be used to provide a time reference. GPS processing unit 810 is programmed with location code and is responsible for calculating pseudo GPS data representing the base station's location and other related information. In addition, a C/A code unit 820 provides the encoding scheme for signals in the civilian band. It should be noted that the base station 800 does not act as a conduit for forwarding GPS satellite information in this aspect of the invention. Rather, the base station 800 produces a pseudosatellite signal that is based on the programmed code in the GPS processing unit 810 and the encoding scheme of the C/A code unit 820. The calculated pseudo GPS data from the GPS processing unit 810 and the C/A code generated by the C/A code unit 820 are combined by a modulator 825 to produce a pseudosatellite signal. Of course, other generators may replace the shown GPS processing unit 810, C/A code unit 820 and modulator 825, as long as they are able to generate a GPS pseudosatellite signal. The pseudosatellite signal produced has the same characteristics as a normal GPS satellite signal.

Next, in order to place the signal into proper form for transmission over the cellular band, a converter converts the pseudosatellite signal to an appropriate radio frequency (RF) signal for transmission over the cellular band. One example of a converter is illustrated as an up converter 830, which is supplied with a local carrier frequency, and a filter 835. In this embodiment, the filter 835 has a 2 MHz bandwidth, with a center frequency equal to the local carrier frequency.

In addition, the base station 800 may also be transmitting other signals created by a cellular radio 845. These represent the typical signals that are transmitted to the mobile terminals to provide the typical speech and signaling services associated with mobile phones. If both signals need to be transmitted together, it is desirable to set the pseudosatellite signal at a level such that it does not interfere with the remaining cellular signals that are to be transmitted. One possible working parameter is to have the pseudosatellite signal broadcast at a level which is at least twenty decibels (dB) lower than the remaining cellular signals.

To carry out this level adjustment, the RF signal is passed through a level adjuster 840 which adjusts the amplitude level of the RF signal such that it is at some predetermined level below that of the remaining cellular signals transmitted through the cellular radio 845. The level of the cellular band signals from the cellular radio 845 may vary over time depending on the cellular system traffic or any transmit power control process utilized by the cellular system. The level adjuster 840 may thus change the level of the pseudosatellite signal over time (dynamically) in response to changes in cellular radio transmissions in order to keep the pseudosatellite signal at the maximum level possible, yet not interfere with the cellular transmissions.

Thereafter, the signals from the cellular radio 845 and the pseudosatellite signal (i.e., the RF signal) are combined by a combiner 850. The combined signal is adjusted by a power amplifier 855 and then transmitted in the cellular band of the cellular network.

It should be understood that, at this point, the base station 800 has created the pseudosatellite signal such that it can be broadcast, together with other cellular signals, in the cellular band of the cellular network to the mobile terminal. The pseudosatellite signal may be decoded by the mobile terminal to determine the range to the base station. The mobile terminal is described in connection with FIG. 9 below.

Turning to FIG. 9, a mobile terminal 900 according to the second aspect of the present invention is described in detail. Mobile terminal 900 generally contains a cellular mobile portion 905 and a GPS receiver portion 910, and a control processing unit 940. Cellular mobile portion 905 generally includes a cellular antenna 915, a low-noise amplifier 920, a down converter 925, a filter 930, an IF section and base band processor 935, and audio outputs 936. The GPS receiver portion 910 generally includes a GPS receiver antenna 945, a low-noise amplifier 950, a first down converter 955, a first filter 960, a second down converter 965, a second filter 970, an analog-to-digital (A/D) converter 975, and a digital signal processor (DSP) 980. In addition, the mobile terminal 900 contains an automatic gain controller or amplitude controller 990 and a switch 995. As readily understood by one of ordinary skill in the art, the particular components shown for the cellular mobile portion and the GPS receiver portion are not necessarily exhaustive of the components contained therein, which any other components are generally known in the art. Furthermore, the present invention contemplates substitutes of the components shown that are capable of carrying out substantially the same functions.

It should be noted that the cellular antenna 915 and the GPS antenna 945 may be formed as a single antenna that is capable of receiving both types of signals. This alternative has the advantage of creating a much more compact mobile terminal. If the single antenna is used, then the low noise amplifiers 920 and 950 may also be combined into a single unit, with response designed for both cellular and GPS bands, and with outputs to connect to down converters 925 and 955.

The cellular signal broadcast from the base station 800, which contains both the pseudosatellite signal and other cellular signals, is received at the mobile terminal 900 by the cellular radio antenna 915, and is then processed through the low-noise amplifier 920, the down converter 925, and the filter 930. These last three elements work to convert the received signal, which has a radio frequency in the cellular band, into a signal having a predetermined intermediate frequency (IF). Of course, any suitable converter may replace the shown low-noise amplifier 920, down converter 925, and filter 930. The IF signal is forwarded to the IF section and base band processor 935, and depending on its contents, is forwarded to the necessary destination in the mobile terminal 900. For example, voice data would be forwarded to audio outputs 936, and control data is forwarded to the control processing unit 940. In addition, the IF signal is also forwarded to the automatic gain controller 990 and thereafter to the switch 995, at input A. The automatic gain controller 990 adjusts the amplitude of the pseudosatellite signal to correspond to the GPS satellite signals, which are described below.

It should be noted that the filter 930 must be constructed to be capable of handling pseudosatellite signals, which are typically wider than conventional cellular signals. Based on the present scheme of satellite signals transmitting at frequencies described above—e.g., C/A code with 1.023 MHz rate—the filter 930 should have the requisite width. For example, a width of at least approximately 2 MHz may be used. In that regard, it is most practical if the cellular system have a bandwidth that is similar to the pseudosatellite signal bandwidth. The typical bandwidth of IS-95 CDMA cellular signals is approximately 1.25 MHz. Therefore, a GPS pseudosatellite signal that is approximately 2 MHz wide could underlay the center of one IS-95 channel, which would mean that it would also overlap two adjacent channels. Other options for transmission over the IS-95 channels could be used. The IF section of 935 will typically include a channel selection filter to separate the desired cellular channel from the other, overlapped, cellular channels.

Moreover, an alternative to the filter 930 would be to have two filters. In such a scenario, one filter handles the pseudosatellite signals and forwards them to automatic gain controller 990. The other filter handles the cellular signals and forwards them to the IF section and base band processor 935. With this dual filter arrangement, the channel selection is performed together by the cellular section of filter 930 and the channel selection filter section of 935.

Referring now to the GPS receiver portion 910, it receives satellite signals by the GPS antenna 945 in the satellite frequency band from the GPS satellites (not shown) that are in clear view. The GPS receiver portion 910 converts those signals to correspond to the IF signal representing the pseudosatellite signal; that is, having the same frequency and substantially the same amplitude. That conversion may be carried out by routing the GPS satellite signals through the low-noise amplifier 950, the first down converter 955, and the first filter 960. The IF signal of the GPS satellite signals is sent to the switch 995, at input B.

The control processing unit 940 is generally responsible for controlling the operation of the switch 995. The control processing unit 940 can be programmed such that it normally has the switch set to input B, but when it determines that it is not receiving the requisite number of GPS signals, it toggles the switch to input A to accept the pseudosatellite signal. Thus, the control processing unit 940 utilizes as many GPS satellites that are in view, and toggles to input A to also receive a pseudosatellite signal when the requisite number of GPS satellites are not in view of the mobile terminal. Those of ordinary skill in the art will recognize that there are numerous alternatives to the stricture shown for switching between the pseudosatellite signals and the GPS satellite signals.

Therefore, the switch 995 chooses the signal at either input A or input B. The selected signal is then processed by another converter—here, the second down converter 965 and the second filter 970—in order to convert the signal into a baseband signal. Thereafter, the signal is converted from an analog signal to a digital signal by the A/D converter 975. Next, the DSP 980 processes the signal to produce a data stream. The control processing unit 940 receives the data stream from the DSP 980 and derives the position of the mobile terminal 900 in a manner known in the art, including calculating pseudoranges that are used to determine the position. It should be noted that the function of calculating position may be carried out by a separate processing unit that is separate from the control processing unit 940.

Thus, the control processing unit 940 is configured to utilize the GPS signals from GPS satellites that are in view, and when the requisite number of GPS satellites are not in view, to also utilize one (or more) pseudosatellite signals from base stations to substitute for the missing GPS satellite signal. That is, a combination of GPS satellite signals and the pseudosatellite signals are utilized to calculate position of the terminal. This approach has the advantage of utilizing GPS, which provides the most reliable position data, to the fullest extent possible, and only rely on the pseudosatellite signals as necessary when GPS alone does not provide the required information.

In the above-described embodiment, the base station may be controlled to broadcast the pseudosatellite signal as a continuous wave signal, i.e., in a continuous manner at all times, or may be controlled to broadcast the signal in a burst mode—i.e., broadcast, for example, twenty percent of the time. If the pseudosatellite signals are broadcast in bursts, the mobile portion 905 must synchronize its reception with the bursts which it may do through knowledge of the burst timing. in any event, the mobile terminal 900 receives this pseudosatellite information whenever it is broadcast by base station 800. Therefore, it can be seen that the broadcast of the pseudosatellite signal by the base station 800, and the receipt of the pseudosatellite signal by the cellular mobile portion 905 in the mobile terminal 900, is carried out without regard to whether GPS receiver portion 910 actually has four GPS satellites in view.

However, when the GPS receiver portion 910 has four GPS satellites in view, the pseudosatellite signal is not needed. If nothing else is done, this signal is disregarded due to the switch 995. However, if desired, the control processing unit 940 may be programmed to utilize the pseudosatellite signal even when the requisite number of GPS signals are available. In such a case, the processor 985 will have available to it five or more pseudoranges (four or more from the GPS satellites and one or more from the base stations). This exceeds the number of signals necessary to carry out a position calculation, but does not negatively affect the position calculation made, and indeed, can improve the accuracy of the position calculation in such an over-determined system.

It should further be noted that in this embodiment of the invention, the base station 800 need not have any GPS satellite signal receiving capabilities itself. That is, the base station produces a pseudosatellite signal independent of receiving and utilizing GPS signals, and therefore it need not have the structure necessary for receiving actual GPS satellite signals. Rather, the base station 800 simply produces a pseudosatellite signal based on a code programmed therein and a particular time reference, which need not be derived from GPS.

This aspect of the invention provides an efficient scheme for producing a pseudosatellite signal, and forwarding that signal to the mobile terminal. The present invention accomplishes this by using an established network—the cellular network—to carry out these functions. By adding very little additional structure to already existing base stations, the need to build dedicated reference stations at strategic locations is obviated. Furthermore, the present invention provides for more efficient use of the cellular band by utilizing it to send additional types of information.

Moreover, the coverage provided by the cellular network generally includes the strategic locations where dedicated reference stations would otherwise be placed, including at airports and in city settings. Furthermore, the cellular network has the advantage of providing coverage where the available number of GPS satellite signals is likely to be insufficient, including in city settings such as in urban canyons or indoors.

In addition, the present invention overcomes the problem that with dedicated reference stations broadcasting pseudosatellite signals, the pseudosatellite signal is stronger than actual GPS satellite signals and drowns out the GPS satellite signals. In the present invention, the pseudosatellite signal produced and broadcast by the base station will not interfere in any way with the actual GPS satellite signals, and therefore will not drown out the GPS satellite signals. In fact, the two are broadcast in completely different frequency bands. That is, the GPS satellite signals are broadcast in the satellite band, while the base station broadcasts the pseudosatellite signal in the cellular band.

Furthermore, when the alternative employing the switch 995 is used, then receipt of the pseudosatellite signal by the control processing unit 940 may be completely prevented when four GPS satellites are in view of the GPS receiver portion. Again, this is an improvement over the conventional system as it enables the local control to select between the pseudosatellite signals and the GPS satellite signals that ate available.

As referred to above, the second aspect of the invention may also be expanded to where more than one base station transmits pseudosatellite signals, and therefore, the position of the mobile terminal 900 may be determined even when two (or more) GPS satellites are not in view. For example, two base stations may transmit pseudosatellite signals, such that the GPS receiver portion 910 may accurately determine its location when only two GPS satellites are in its view. Indeed, any combination of base stations and satellites could be used. When no GPS satellites are in view, then four base stations could be used to calculate position. Of course, it may also be desirable to use as many GPS satellites that are in view, along with all the available pseudosatellite signals, to obtain an over-determined result that may be more accurate.

Third Aspect

Referring now to FIGS. 10–13, a third aspect of the present invention will be described. As with the second aspect of the invention, this aspect also addresses the situation where the requisite number of GPS satellites are not in view of a GPS receiver. Broadly, in this aspect of the invention, the mobile terminal has the capabilities of calculating its position using GPS, and also using the cellular network infrastructure, such as by the TOA or TDOA methods of determining location. The mobile terminal will generally use the GPS structure to .calculate position. However, when the requisite number of GPS satellites are not in view, then it will switch to calculating position using either only the cellular network infrastructure, or a combination of the GPS satellite signals available and the cellular network infrastructure. When the requisite number of GPS satellites return into view, then the mobile terminal switches back to relying exclusively on GPS.

Figure 10:
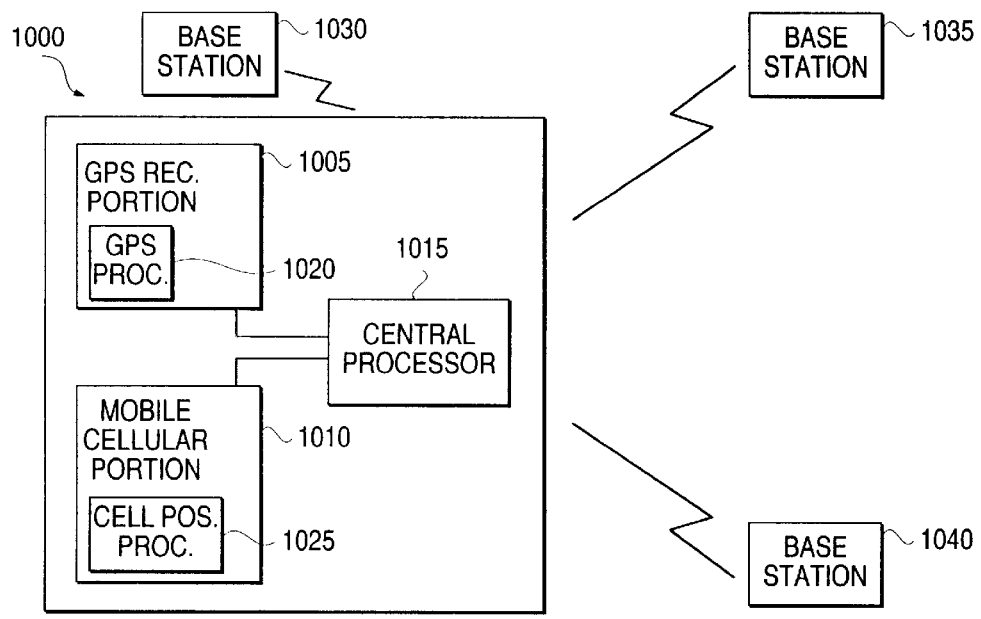
FIG. 10 is a block diagram of a mobile terminal and base stations according to a third aspect of the position location system of the present invention.

First, in FIG. 10, a mobile terminal 1000 includes a GPS receiver portion 1005, a mobile cellular portion 1010, and a central processor 1015. Of course, the central processor 1015 may alternatively be formed integral with either the GPS receiver portion 1005 or the mobile cellular portion 1010, or a single processor can be used that performs the functions of all three components. GPS receiver portion 1005 includes a GPS processor 1020 for calculating position, while the mobile cellular portion 1010 contains a cellular position processor 1025 that computes position using the cellular network infrastructure. Finally, as shown in FIG. 10, base stations 1030, 1035, and 1040 are part of the cellular network, and for purposes of explanation, they represent the base stations whose transmitting vicinity includes the location of the mobile terminal 1000.

Figure 11:
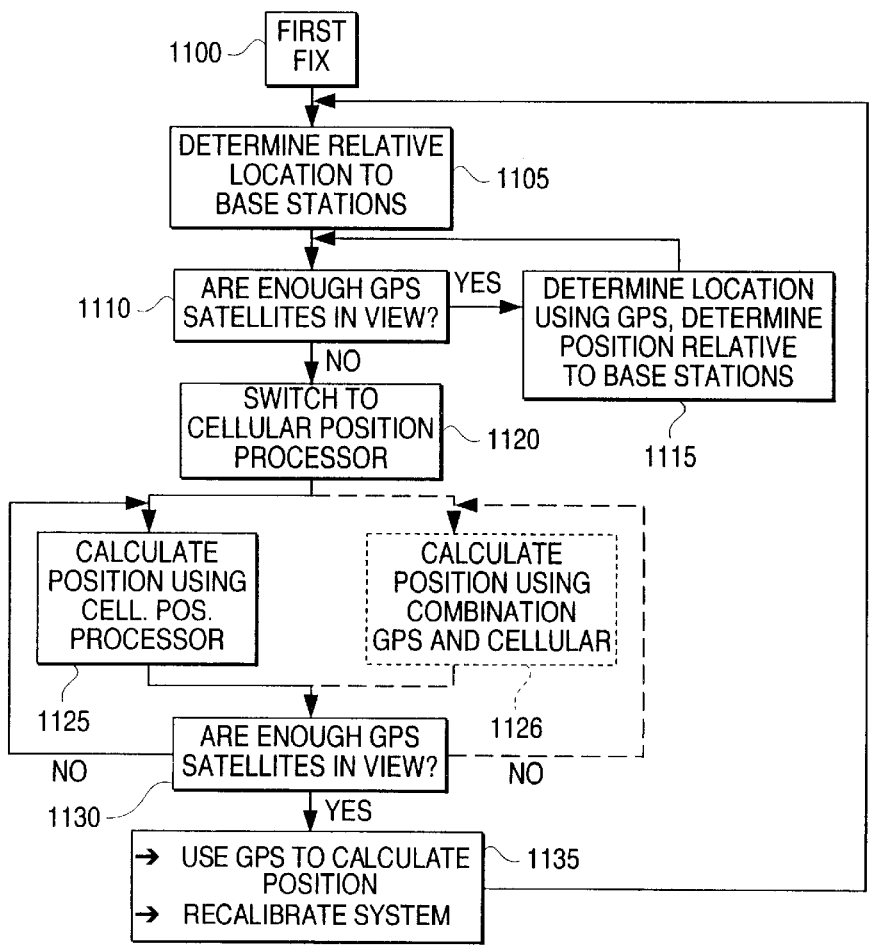
FIG. 11 is a flowchart depicting operation of the position location system according to the third aspect of the present invention.

Operation of the mobile terminal 1000 for determining position is described in connection with the flowchart in FIG. 11. At block 1100, GPS receiver portion 1010 obtains a first fix on the location of the mobile terminal, if necessary. Next, at block 1105, the first fix location and the locations of three (or more) nearby base stations are transmitted to cellular position processor 1025. In this case, the nearby base stations are base stations 1030, 1035, and 1040. Cellular position processor 1025 utilizes this information, along with the location of mobile terminal 1000 as determined in step 1100, to determine the expected time difference of arrival of periodic signals from base stations 1030, 1035, and 1040. For the purposes of this explanation, it is assumed that periodic signals are available in the cellular network, and the mobile terminal uses the TDOA process, described earlier, to determine its position from the cellular network signals. However, the cellular position processor could alternatively use a TOA technique.

In particular, in order to calculate the TDOA of the periodic signals from each base station 1030, 1035, 1040, the cellular position processor 1025 calculates the distance between the mobile terminal 1000 and each of the base stations 1030, 1035, and 1040, using the location measurement for each item. Using the known distances and the speed of propagation of the radio signals, the cellular position processor 1025 calculates the expected time difference of arrival of the signals from each base station pair. In a completely synchronized system, the time of transmission of the periodic signals from each base station is the same, or at some specified time offset (which can be subtracted out). By comparing the expected TDOA with the measured TDOA, the cellular position processor 1025 can determine the time offset of the signals from each base station, and use these to correct later TDOA measurements for these base stations. In addition, the range, or distance to the base station, may be calculated from the amount of time that it took for the periodic signal to travel from the base station to the mobile terminal, i.e., the propagation delay of the signal.

Therefore, knowledge of the position of mobile terminal 1000—as calculated by the GPS receiver portion 1005—helps to determine the time offset of transmission of the periodic signals from the base stations, which may be unknown in cellular systems (except, for example, some CDMA systems implementing the IS-95 standard). This time offset of transmission for each base station pair is stored in cellular position processor 1025. Alternatively, the time offset of transmission may be stored in central processor 1015.

Thereafter, as long as the requisite number of GPS satellites are in view of GPS receiver portion 1005, the GPS receiver portion continues to calculate position in this manner. Thus, in block 1110, the GPS receiver portion 1005 determines whether the requisite number of GPS satellites are in view. If the requisite number of GPS satellites are in view (i.e., the answer to the inquiry is "yes"), then at block 1115, the GPS receiver portion 1005 again calculates (or simply updates) the position of the mobile terminal using GPS. This process is generally repeated every second or few seconds. Of course, the time between successive calculations can be set to any desired amount. In addition, at block 1115, the time offset of transmission of the periodic signals from each base station may be recalculated and updated, and stored in the cellular position processor 1025 or the central processor 1015. Then, the next step will be at block 1110, where the same inquiry as to the requisite number of GPS satellites being in view is made.

However, if the answer to the inquiry at block 1110 is "no," that is, the number of visible GPS satellites has dropped below the requisite level (usually four), then the position determination for the mobile terminal 1000 is switched over to the cellular position processor 1025. This is shown at block 1120. The switching over may be carried out by the central processor 1015. In addition, the information of the last known position of the mobile terminal 1000 and each of the base stations 1030, 1035, and 1040, along with the time offset of transmission of the periodic signal from the base stations, is made available to cellular position processor 1025 if it does not already have the information. The cellular position processor 1025 calculates position using the periodic signals from the base stations, as described below.

Turning to operation of the cellular position processor 1025, indicated at block 1125, the processor 1025 will measure the TDOA for the signals from the base stations. However, because the mobile terminal has likely since moved, the measured TDOA will differ from the previous values after correction for the transmission time offsets. The processor 1025 may then calculate the new position using the new, corrected TDOA measurements as the intersection of the hyperbolic surfaces as discussed earlier.

In essence, at block 1125, the cellular position processor 1025 uses the cellular network infrastructure to determine its location, for example, by using either the TOA or TDOA methods for determining location, as discussed previously. Alternatively, any other method of determining location based on the cellular network infrastructure can be used. In general, the point is that the cellular position processor 1025 calculates position based on using cellular position signals, such as the periodic signals, rather than using GPS satellite signals. That is, the cellular position signals do not contain GPS information and rather are independent of GPS. Thus, this aspect is unlike the second aspect where the pseudosatellite signals generated and forwarded by the base station are like GPS signals.

An alternative to switching over to using a method for determining position of the mobile terminal based exclusively on the cellular network infrastructure, such as the TOA or TDOA method, is to use a combination of the GPS satellite signals and the base station periodic signals to determine location. This is generally indicated by dotted block 1126 and the associated dotted lines. For example, for purposes of explanation, it may be assumed that only three GPS satellites are in view of the GPS receiver portion. The pseudorange determined for two of these satellites provides a distance measurement between each GPS satellite and the mobile terminal. The third satellite signal provides a time reference used to calculate the range to the other two satellites. That is, the mobile terminal 1000 lies somewhere on a sphere around the GPS satellite, having a radius equal to the distance therebetween. In addition, calculating the distance between the mobile terminal and one base station, the method for which is described above, provides a third distance measurement. Therefore, the three GPS satellites, along with the one base station, provides three spheres whose intersection represents the location of the mobile terminal. Of course, more than one base station may be used to ensure that an accurate location determination is made.

In either case—using the method according to block 1125 or block 1126—once the location determination is made, the next inquiry at block 1130 will be the same as the inquiry made at block 1110, i.e., whether the requisite number of GPS satellites are in view of the GPS receiver portion. If the requisite number of GPS satellites are not in view, then the same process—in either block 1125 or block 1126—is performed to determine position. This loop between blocks 1125 or 1126 and block 1130 continues until the requisite number of GPS satellites come back into view.

When enough GPS satellites are again in view of the GPS receiver portion, then the answer to the inquiry at block 1130 becomes "yes," and the system proceeds to block 1135. At block 1135, determination of position again becomes the responsibility of GPS receiver portion 1005. This switching back to using the GPS receiver portion for calculating position may be carried out by the central processor 1015. In addition, at this block, determinations of the location of the nearest base stations, and their locations and time offsets of transmission of their periodic signals, are all updated. In sum, the system is recalibrated just as if it started out using GPS. Thereafter, the process is returned to block 1105, and is repeated.

In addition, it should be noted that at block 1100, if an initial location fix cannot be made using the GPS receiver portion 1005 because the requisite number of GPS satellites are not in view, then the central processor 1015 can request that the cellular positior. processor 1025 provide an initial location of the mobile terminal using the conventional TDOA method of determining location using the cellular network infrastructure, as described previously herein. However, once the requisite number of GPS satellites come into view of the GPS receiver portion, then the central processor 1015 will cause the system to switch over to determining location of the mobile terminal using the GPS receiver portion.

The GPS provides good accuracy of position when its signals are available to the mobile terminal. This may be more accurate than methods using exclusively signals provided by the cellular network infrastructure. Thus, it can be preferable to make use of the GPS for determining position, and to make use of a combination of the GPS and the cellular infrastructure when the GPS is unavailable, or partly unavailable, to the mobile terminal. It is, of course, preferable to make use of as many signals from both systems as are available to develop a more accurate result than could be obtained by working with either system exclusively.

However, a competing interest is reducing power consumption. As shown in FIG. 10, two receivers are present in the terminal. To save power consumption (i.e., save battery power), it may be desirable to rely on the cellular network infrastructure to calculate position. During this time, the GPS receiver would not be turned on. Only when the cellular network infrastructure does not provide the necessary signals to determine position, or if a GPS recalibration was needed, would the GPS receiver be turned on and utilized to determine position. This alternative approach conserves battery power.

Figure 12:
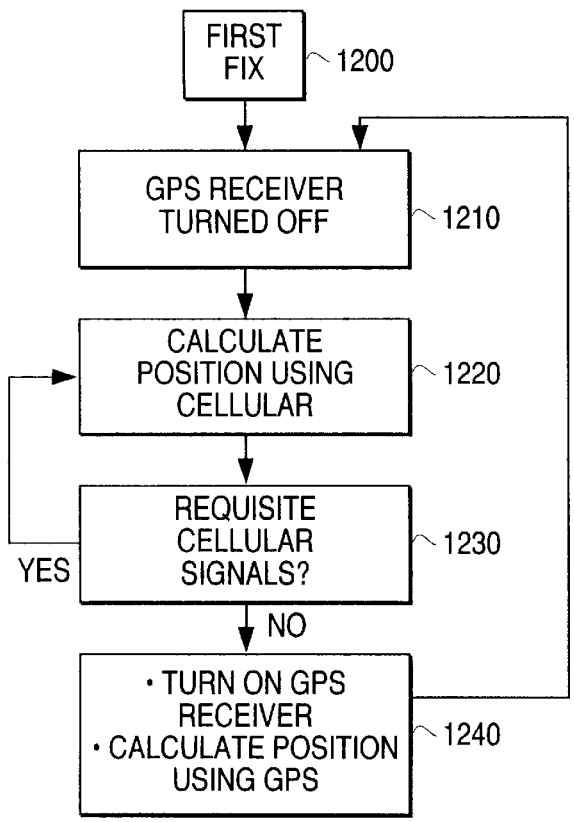
FIG. 12 is a flowchart depicting operation of the position location system according to an alternative of the third aspect of the present invention.

The alternative approach is shown in FIG. 12. At block 1200, a first fix is calculated. Then, at block 1210, the GPS receiver is turned off, and at block 1220, position is calculated using the cellular network infrastructure. At block 1230, a determination is made whether the requisite number of signals in the cellular network infrastructure are available for calculating position (e.g., three signals in the TDOA approach). If so, then block 1220 is repeated. If not, then at block 1240, the GPS receiver is turned on and the position is calculated using GPS. Thereafter, the process is repeated starting at block 1210. Alternative inquiries at block 1230 include determining how long (in time) it has been since the last GPS update and/or how far (in space) the mobile terminal has moved since the last GPS update. If a predetermined amount of time has passed, such as two minutes, or the mobile terminal has moved a predetermined distance, such as 100 meters, then a GPS update would be called for and the process proceeds to block 1240. Of course, the rate at which GPS updates are needed will depend on the conditions under which the mobile is operating, with less frequent updates needed if the mobile terminal is in an area where the cellular network infrastructure signals are known to be of good accuracy.

Figure 13:
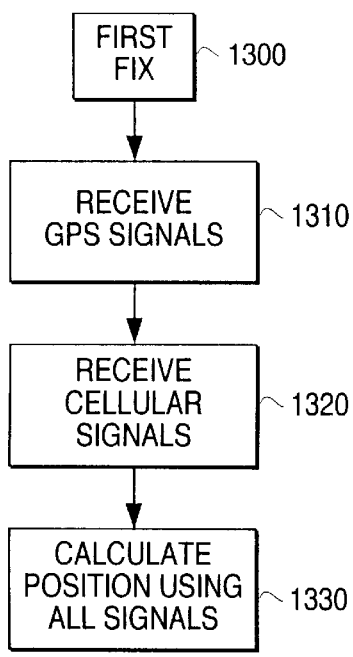
FIG. 13 is a flowchart depicting operation of the position location system according to a further alternative of the third aspect of the present invention.

Another approach with the third aspect for determining position is that shown in FIG. 13. At block 1300, a first fix is obtained. At block 1310, all the available GPS satellite signals are received by the GPS receiver portion. Then, at block 1320, all the available cellular positioning signals are received. At block 1330, position is calculated using all of these signals. This is an overdetermined system, and the results may be combined. This may be done by weighting each location measurement in the average by the confidence, or expected error, in the measurements. Such a technique is known as weighted average. This technique may be used to combine together location measurements based on available GPS signals with measurements based on cellular infrastructure signals with appropriate regard to the accuracy of each measurement. The weighted average may be calculated according to the following general expression for an averaged position coordinate x $$x = 1/w \ \Sigma x n/\sigma n^2$$

where xn are the measurements, σn are the expected errors, or variances, in the measurements used to weight the average, and $w = \Sigma 1/\sigma n^2$ is the sum of the variances used to normalize the estimate. The summations are performed over the total number of measurements N. This choice of weighting factors minimizes the variance of the estimate of x.

The third aspect of the invention has numerous advantages. For one, as with the first and second aspects of the invention, this aspect efficiently utilizes the cellular network, and positioning determination methods available therewith, to compute the position of a mobile terminal when the GPS receiver does not have the required number of GPS satellites in view. Furthermore, the system is efficient because it utilizes the more accurate means for determining location—GPS—whenever the requisite number of GPS satellites are available.

In addition, there is another advantage to switching back to GPS after the mobile terminal has been using the cellular network infrastructure for some period of time to determine location. By switching back to GPS, and recalibrating the system, the negative effect of multi-path problems associated with using the TOA and TDOA methods for determining location is reduced. That is, after some period of time of using the TOA or TODA methods to determine location, the mobile may have moved out of the region for which the last calibration is appropriate. Recalibrating with the GPS enables any errors due to the use of the cellular infrastructure signals to be again determined and corrected.

By switching back to using GPS as soon as it becomes feasible, the TOA or TDOA methods will be used for the absolute minimum amount of time, which limits the effect of errors due to multi-path problems. Using both the GPS and cellular signals, an estimate may be made of the multipath propagation errors in the cellular signals.

Furthermore, another problem associated with calculating position based on cellular network infrastructure is clock drift of the clock in the mobile terminal. That clock drift can result in erroneous time—and therefore location—measurements. By switching back to GPS as soon as it becomes available, the time in which the TOA or TDOA methods are used is relatively short. Thus, the amount of error due to clock drift, which increases the longer the cellular network infrastructure methods are used, can be minimized. In addition, by measuring the rate of clock drift in the mobile terminal using the GPS time information while the GPS signals are available, a software routine may be implemented, for example, in the central processor, to compensate for this clock drift when GPS is not available at a subsequent point in time.

Fourth Aspect

Figure 14:
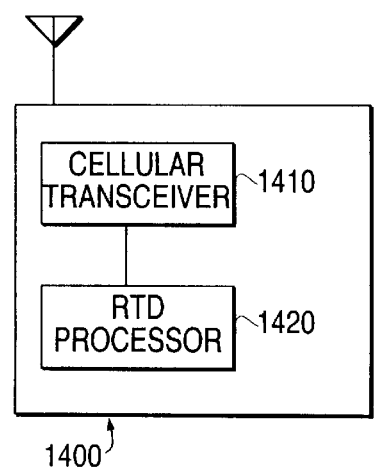
FIG. 14 is a block diagram of a base station for implementing a fourth aspect of the position location system of the present invention.
Figure 15:
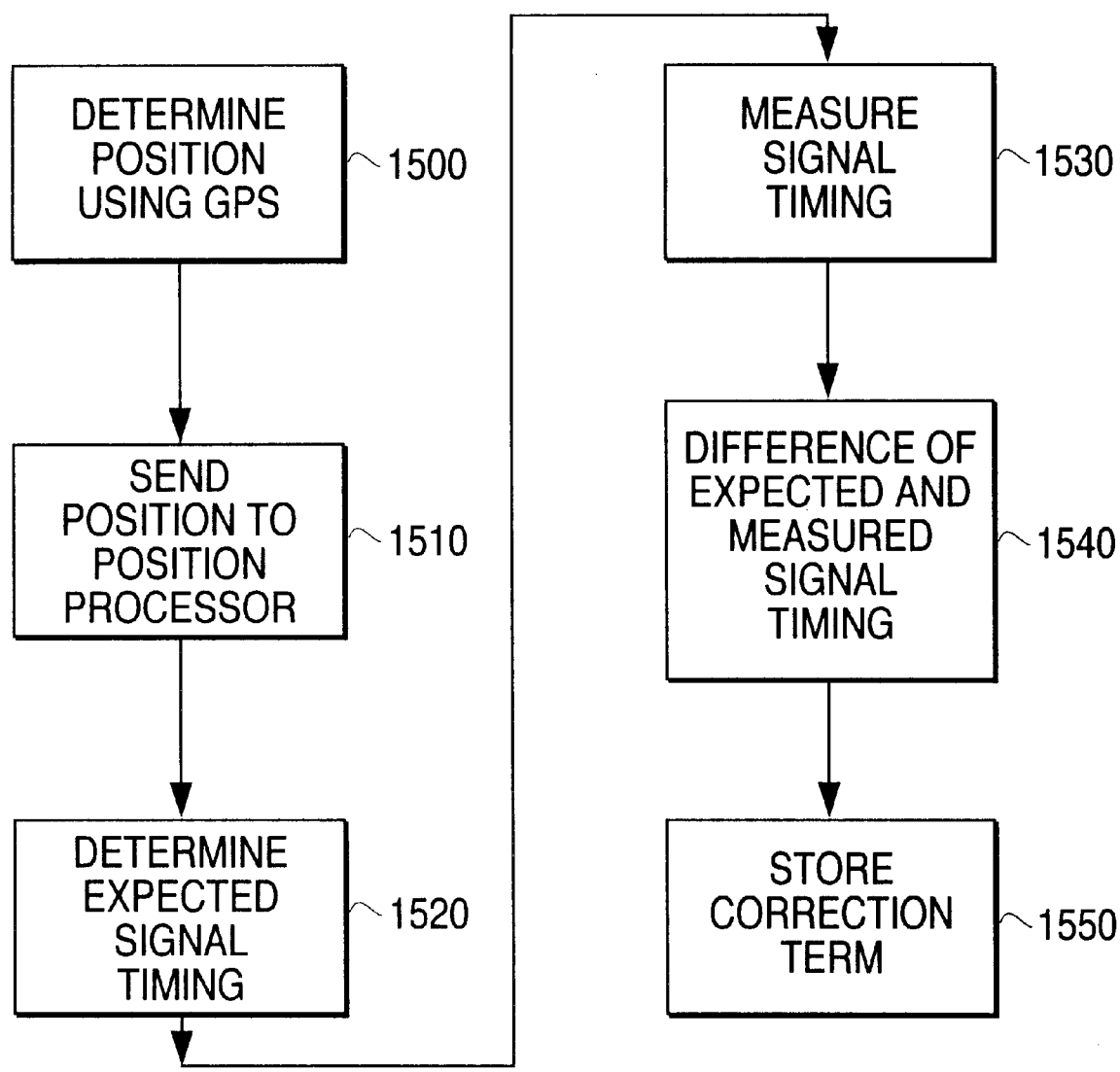
FIG. 15 is a flowchart depicting carrying out a correction calculation according to the fourth aspect of the position location system of the present invention.

A fourth aspect of the invention may be described in connection with the structure shown in FIG. 10, and FIGS. 14-15. In a standard IS-95 CDMA system, the pilot signal component of the CDMA cellular base station signal can be used to augment and improve the accuracy and availability of position location using GPS. The CDMA cellular signal can provide the functional equivalent of the GPS pseudorange. The advantage is that this approach requires very little adaptation of the base station, for example, compared to the second aspect described above. The CDMA pilot signal component, such as used in the IS-95 standard, has the advantage of being transmitted continuously from each base station at a constant power level that enables it to typically be received by a mobile terminal from more than one base station. The pilot signal includes periodic signals that are transmitted at specified times with specified offsets. Thus, the time difference of arrival of two pilot signals from two base stations may be readily measured by the mobile terminal. The IS-95 standard signalling and control process also includes methods whereby the terminal may be instructed to measure the TDOA of the pilot signals it can receive and to report these measurements to the CDMA control process. Other facets of the IS-95 pilot signals and the standard transmissions enable a round trip delay ("RTD") measurement to be made which may be used to determine the mobile's range, or distance, from the serving base station. Either the RTD measurement or a plurality of TDOA measurements may be used to obtain a cellular distance measurement, which represents the distance between the mobile and the serving base station.

In this approach, a base station, such as base station 1035, transmits timing signals to the terminal. In fact, this is already being done as part of the regular cellular system transmissions such as according to IS-95 or GSM standards. The terminal will receive the signals at some later time due to the delay in transmission. The terminal will extract the timing signals from the base station, though those signals will be offset in time due to the propagation delay. Further, the terminal must transmit back to the base station at defined times with respect to its receipt of the timing signals from the base station. For example, the terminal may be required to respond within plus or minus one microsecond (+1μs) of its specified transmission timing. The base station then receives the return signals from the terminal at some later time due to delay in return transmission. The total delay measured at the base station is the RTD. The radius of the sphere—representing the distance between the base station and the terminal—is one half the RTD times the speed of radio signals in air. This measurement may be generally referred to as a cellular distance measurement. The cellular distance measurement, like the cellular position signal of the third aspect, does not contain GPS information and rather is independent of GPS.

Therefore, this distance measurement can be used as a substitute for a GPS signal when the requisite number of GPS satellite signals are not in view, or to supplement the information available from GPS so that both GPS and cellular signals are used together in order that a more accurate position determination may be made than by either system operating alone. The advantage of this approach is that the only change to the base station is the addition of the RTD determination, which can be done by a processor. FIG. 14 shows a typical base station 1400 with a cellular transceiver 1410 for performing conventional functions and a RTD processor 1420 that determines RTD.

However, errors are present in the above position estimate, largely due to the terminal's internal delays and multi-path propagation. While the uncertainty is generally less than 1 microsecond, this translates into an uncertainty in distance of about 150 meters.

To compensate for this error, GPS can be used. This approach is depicted in FIG. 15. When a requisite number of reference GPS satellites are in view, the position of the terminal can be determined. The reference GPS satellites need not be the same GPS satellites that the mobile makes use of at some later point in time when the requisite number of GPS satellites are not in view. This determination is shown in block 1500. The position may be sent to a position processor which may be located either in the mobile terminal (such as 1025 in FIG. 10) or may be a server in the network which operates to calculate positions for terminals using the cellular and communications networks. This is shown at block 1510. In addition, it is noted that the locations of the base stations are known. At block 1520 the position processor determines the expected signal timing using information on the position of the babe station and the position of the mobile as determined using GPS. For example, in the case of a system using the RTD measurement process described earlier, the expected RTD would be calculated. Alternatively, for a system using the TDOA measurement process described earlier, the expected TDOA would be calculated. Then at block 1530 a measurement is made of the actual signal timing, for example the RTD or the TDOA. At block 1540, the difference between the expected and the measured values is determined. The difference is stored, at block 1550, as a cellular collection term (i.e. a RTD or TDOA correction term) for later use by the position processor. If the position processor is located in the mobile terminal, then the RTD measurements, which are made in the base station, may be sent to the mobile terminal using the standard message signalling facilities of the cellular system. Similarly, if the position processor is connected to the communications network, the TDOA measurements made in the terminal may be sent to the position processor using the standard message signalling facilities of the cellular system. Of course, to determine the position to the best accuracy, the position processor may make use of both TDOA and RTD measurements in its calculations and need not be restricted to a single measurement type.

Thereafter, when the requisite number of GPS satellite signals are not in view at some later point in time, and position is calculated based in part using the RTD measured at the base station, or the TDOA measured at the terminal, the correction term can be used to reduce the error due to the unknown delay in the terminal as seen at the serving base station. It is contemplated that the position location calculation be done by the network server, or in a suitable processor in the terminal (such as central processor 1015 or position processor 1025 in FIG. 10). In the alternative, the cellular position processor 1025 in the mobile terminal could measure TDOA of the cellular pilot signals and use these to supplement the GPS position information.

It should be noted that other systems (in addition to the IS-95 CDMA technique discussed) exist that are capable of measuring the RTD, such as the GSM (European standard) that utilizes TDMA (Time Division Multiple Access) cellular techniques. The same concept of utilizing cellular distance measurements as substitutes for missing GPS satellite signals may be readily applied in such systems. Typically GSM systems are operated with unknown time offsets in the transmissions from each base station. In this case the correction terms, determined through the use of the GPS calibrations, also compensate for the unknown time offsets of the GSM base station transmissions.

It should be understood that while the four aspects of the position location system of the present invention have each been described, and may be used, separately, two or more aspects may be combined in a single position location system. For example, the DGPS error correction information may be provided to the mobile terminal through the cellular network according to the first aspect of the invention, and in that same system, a base station of the cellular network may also provide a pseudosatellite signal. In such a system, the control processing unit 940 would utilize the error correction data and correct the GPS pseudoranges to obtain corrected GPS ranges. Thus, the DGPS processor would essentially be part of the control processing unit. Of course, a separate DGPS processor could be used instead.

Alternatively, the first and fourth aspects could be combined. DGPS error correction data would be provided to the mobile terminal and the base station could provide the CDMA cellular signals that provide the functional equivalent of the GPS satellite signal. Another alternative is that the DGPS error correction information be provided through the cellular network infrastructure in a system that also switches between using GPS and the cellular network infrastructure to determine location.

Furthermore, the position location system may have the second, third, and fourth aspects of the invention available, and the system merely determines which aspect to utilize when the requisite number of GPS satellites are not in view of the GPS receiver. The selection of the desired approach could be carried out, for example, by a processor such as the central processor 1015 of the mobile terminal, shown in FIG. 10. Finally, all four aspects may be combined in a single position system as well. Therefore, the present invention is not limited to using only one aspect of the invention in a single position location system. Rather, two or more aspects of the invention can be used in the same position location system.

In addition, changes to the structures as presented above do not depart from the scope of the present invention. For example, a mobile terminal may contain both the GPS and cellular portions in the same mobile unit, or each component can be housed separately with a relevant means for communication between the two. In that regard, the term "mobile terminal" may refer to a terminal containing either a GPS receiver or a cellular mobile terminal, or both. Furthermore, many of the individual components may be combined into a single unit with other components. For example, the central processor in the third aspect of the invention may be contained in either the GPS receiver portion or the mobile cellular portion.

Furthermore, substitute components that provide substantially the same functions as those disclosed also do not depart from the scope of the invention. For example, alternate structures known in the art for converting a received signal into an intermediate frequency (IF) may be used rather than the structure disclosed herein. Finally, the general components shown for the mobile terminals, base stations, and MTSO do not necessarily indicate that this is the only structure present in these items. Rather, the illustration of certain components is intended for an easier understanding of the present invention. Finally, while the connections in the Figures, for example between the DGPS processor and the GPS receiver in FIG. 5, are shown as electrical connections, it should be understood that other connections are possible, such as optical connections.

We claim:

1. A position location system for determining a geographic position comprising:

a global positioning system (GPS) receiver that receives global positioning system satellite signals from a plurality of global positioning system satellites, and calculates the geographic position using the received global positioning system satellite signals;

a mobile cellular portion that receives cellular position signals that do not contain data in a GPS-like format from a plurality of cellular network base stations and calculates the geographic position using the received cellular position signals; and a central processor connected to said global positioning system receiver and to said mobile cellular portion, wherein said central processor control operation of said global positioning system receiver and said mobile cellular receiver.

2. The position location system of claim 1, wherein said central processor causes one of said global positioning system receiver and said mobile cellular portion to calculate the geographic position.

3. The position location system of claim 2, wherein said central processor causes said global positioning system receiver to calculate the geographic position when a requisite number of the plurality of global positioning system satellites are in view of said global positioning system receiver.

4. The position location system of claim 2, wherein said central processor causes said mobile cellular portion to calculate the geographic position when a requisite number of the plurality of global positioning system satellites are not in view of said global positioning system receiver.

5. The position location system of claim 4, wherein said central processor is configured to calculate a clock drift error measurement, and is further configured to correct the calculated geographic position using said clock drift error measurement to obtain a corrected geographic position.

6. The position location system of claim 2, wherein said central processor causes said mobile cellular receiver to calculate the geographic position when a requisite number of cellular signals are being received, and causes said global positioning system receiver to be substantially turned off when the requisite number of cellular signals are being received.

7. The position location system of claim 1, further comprising a mobile terminal that houses said global positioning system receiver, said mobile cellular portion, and said central processor.

8. The position location system of claim 1, wherein said central processor is integrally formed with one of said global positioning system receiver and said mobile cellular portion.

9. The position location system of claim 1, wherein said mobile cellular portion calculates the geographic position using one of a time of arrival method for calculating geographic position and a time difference of arrival method for calculating geographic position.

10. The position location system of claim 1, wherein said mobile cellular portion further comprises:

a cellular antenna that receives a radio frequency signal having a frequency in a cellular frequency band, said radio frequency signal containing differential error correction data;

a radio interface unit connected to said cellular antenna, wherein said radio interface unit converts said received radio frequency signal into an intermediate frequency signal;

a digital signal processor connected to said radio interface unit, wherein said digital signal processor converts said intermediate frequency signal into a data stream;

a central processor connected to said digital signal processor, wherein said central processor extracts said differential error correction data from said data stream; and a differential global positioning system processor connected to said central processor, wherein said central processor forwards said differential error correction data to said differential global positioning system processor.

11. A method for determining a geographic position of a mobile terminal comprising the steps of:

receiving global positioning system satellite signals from a plurality of global positioning system satellites;

receiving a plurality of cellular position signals;

calculating the geographic position of the mobile terminal using said received global positioning system satellite signals when a requisite number of the plurality of global positioning system satellites are in view of a global positioning system receiver; and calculating the geographic position of the mobile terminal using only said received plurality of cellular position signals when the requisite number of the plurality of global positioning system satellites are not in view of the global positioning system receiver.

12. The method of claim 11, further comprising the steps of:

receiving a differential error correction data signal containing differential error correction data; and correcting said calculated geographic position using said differential error correction data.

13. The method of claim 12, wherein said differential error correction data signal is received in a form of a cellular signal having a frequency in a cellular frequency band, the cellular signal including differential error correction data as position location information, and also including non-position location information, and further comprising the step of demodulating said cellular signal to obtain said differential error correction data signal and said non-position location information and to output said differential error correction data on a first communications path and to output said non-position location information on a second communications path different than said first communications path.

14. The method of claim 11, further comprising the step of forwarding the geographic position calculated using said received global positioning system satellite signals to a mobile cellular portion in the mobile terminal.

15. The method of claim 11, wherein said step of calculating the geographic position of the mobile terminal using said received global positioning system satellite signals is carried out using a global positioning system receiver in the mobile terminal.

16. A method for determining a geographic position of a mobile terminal comprising the steps of:

receiving global positioning system satellite (GPS) signals from a plurality of global positioning system satellites;

receiving a plurality of cellular position signals that do not contain data in a GPS-like format;

calculating the geographic position of the mobile terminal using said received global positioning system satellite signals when a requisite number of the plurality of global positioning system satellites are in view of a global positioning system receiver; and calculating the geographic position of the mobile terminal using both said received plurality of cellular position signals and substantially all of said received global positioning system satellite signals when the requisite number of the plurality of global positioning system satellites are not in view of the global positioning system receiver.

17. A method for determining a geographic position of a mobile terminal comprising the steps of:

receiving global positioning system satellite (GPS) signals from a plurality of global positioning system satellites;

receiving a plurality of cellular position signals that do not contain data in a GPS-like format; and calculating the geographic position of the mobile terminal using substantially all of the received global positioning system satellite signals and substantially all of said received plurality of cellular position signals.

* * * * *